(12) United States Patent
Almer et al.

(10) Patent No.: US 10,510,433 B2
(45) Date of Patent: Dec. 17, 2019

(54) ELECTROMAGNETIC RADIATION SHIELDING TILE HAVING ELECTROMAGNETIC SHIELDING FABRIC AND METAL PORTIONS

(71) Applicant: RICH MEDIA INSTITUTE, Marina Del Rey, CA (US)

(72) Inventors: Markus Almer, Marina del Rey, CA (US); Ari R Blank, Las Vegas, NV (US)

(73) Assignee: Shield Your Body LLC, Las Vegas, NV (US)

( * ) Notice: Subject to any disclaimer, the term of this patent is extended or adjusted under 35 U.S.C. 154(b) by 0 days.

(21) Appl. No.: 15/507,073

(22) PCT Filed: Aug. 26, 2015

(86) PCT No.: PCT/US2015/047016
§ 371 (c)(1),
(2) Date: Feb. 27, 2017

(87) PCT Pub. No.: WO2016/033227
PCT Pub. Date: Mar. 3, 2016

(65) Prior Publication Data
US 2017/0278585 A1    Sep. 28, 2017

Related U.S. Application Data

(60) Provisional application No. 62/081,118, filed on Nov. 18, 2014, provisional application No. 62/064,931, (Continued)

(51) Int. Cl.
*H05K 9/00* (2006.01)
*G12B 17/02* (2006.01)
(Continued)

(52) U.S. Cl.
CPC .............. *G12B 17/02* (2013.01); *B32B 5/02* (2013.01); *B32B 5/024* (2013.01); *B32B 5/08* (2013.01);
(Continued)

(58) Field of Classification Search
None
See application file for complete search history.

(56) References Cited

U.S. PATENT DOCUMENTS

| 4,435,465 A | 3/1984 | Ebneth et al. |
| 5,275,880 A | 1/1994 | Boyer, III et al. |

(Continued)

FOREIGN PATENT DOCUMENTS

CN     103211375 A  *  7/2013

OTHER PUBLICATIONS

PCT Search Report and Written Opinion dated Dec. 7, 2015 for PCT Application No. PCT/US15/47016, 8 pages.

*Primary Examiner* — James Choi
(74) *Attorney, Agent, or Firm* — Lee & Hayes, P.C.

(57) ABSTRACT

In some examples, an electromagnetic (EM) shielding file is described. The EM radiation shielding tile may include one or more of an EM radiation shielding fabric layer, a mu metal layer, and/or a microwave absorbing layer. In some cases, the EM radiation shielding tile may be configured to bond to clothing, electronic devices, or other objects to deflect and/or absorb electromagnetic field radiation.

19 Claims, 21 Drawing Sheets

Related U.S. Application Data filed on Oct. 16, 2014, provisional application No. 62/043,047, filed on Aug. 28, 2014.

(51) Int. Cl.

| | | |
|---|---|---|
| *G21F 3/00* | (2006.01) | |
| *G21F 1/12* | (2006.01) | |
| *B32B 5/02* | (2006.01) | |
| *B32B 5/08* | (2006.01) | |
| *B32B 5/18* | (2006.01) | |
| *B32B 5/22* | (2006.01) | |
| *B32B 5/24* | (2006.01) | |
| *B32B 9/00* | (2006.01) | |
| *B32B 9/04* | (2006.01) | |
| *B32B 15/04* | (2006.01) | |
| *B32B 15/08* | (2006.01) | |
| *B32B 15/14* | (2006.01) | |
| *B32B 15/18* | (2006.01) | |
| *B32B 27/06* | (2006.01) | |
| *B32B 27/12* | (2006.01) | |
| *B32B 27/30* | (2006.01) | |
| *B32B 27/36* | (2006.01) | |
| *B32B 5/00* | (2006.01) | |
| *B32B 15/00* | (2006.01) | |
| *B32B 27/00* | (2006.01) | |

(52) U.S. Cl.
CPC ................ *B32B 5/18* (2013.01); *B32B 5/22* (2013.01); *B32B 5/24* (2013.01); *B32B 5/245* (2013.01); *B32B 9/007* (2013.01); *B32B 9/04* (2013.01); *B32B 9/041* (2013.01); *B32B 9/045* (2013.01); *B32B 9/047* (2013.01); *B32B 15/04* (2013.01); *B32B 15/046* (2013.01); *B32B 15/08* (2013.01); *B32B 15/14* (2013.01); *B32B 15/18* (2013.01); *B32B 27/06* (2013.01); *B32B 27/065* (2013.01); *B32B 27/12* (2013.01); *B32B 27/30* (2013.01); *B32B 27/36* (2013.01); *B32B 27/365* (2013.01); *G21F 1/125* (2013.01); *G21F 3/00* (2013.01); *H05K 9/0007* (2013.01); *H05K 9/0081* (2013.01); *B32B 5/00* (2013.01); *B32B 15/00* (2013.01); *B32B 27/00* (2013.01); *B32B 2255/02* (2013.01); *B32B 2255/26* (2013.01); *B32B 2262/0261* (2013.01); *B32B 2262/0276* (2013.01); *B32B 2262/062* (2013.01); *B32B 2262/103* (2013.01); *B32B 2262/14* (2013.01); *B32B 2305/18* (2013.01); *B32B 2307/212* (2013.01); *B32B 2437/00* (2013.01); *B32B 2439/06* (2013.01); *B32B 2439/46* (2013.01); *B32B 2457/00* (2013.01)

(56) References Cited

U.S. PATENT DOCUMENTS

| | | |
|---|---|---|
| 5,595,801 A | 1/1997 | Fahy et al. |
| 5,603,196 A | 2/1997 | Sohlstrom |
| 2003/0224681 A1* | 12/2003 | Koch ................ G21F 3/02 442/131 |
| 2004/0198264 A1* | 10/2004 | Saur ................ H01Q 1/245 455/117 |
| 2010/0163758 A1* | 7/2010 | Kirschenbaum ............ A61F 13/49007 250/516.1 |
| 2012/0047631 A1* | 3/2012 | Connolly ............ A41D 27/02 2/272 |
| 2012/0111627 A1* | 5/2012 | Kato ................ B32B 5/022 174/388 |
| 2012/0248346 A1* | 10/2012 | Chowdhary ............ G21F 1/00 250/516.1 |
| 2013/0105215 A1* | 5/2013 | Morris ................ H02G 3/0412 174/394 |
| 2013/0122975 A1 | 5/2013 | Ha |
| 2013/0153795 A1* | 6/2013 | DeBaun ................ G21F 1/00 250/515.1 |
| 2014/0051480 A1 | 2/2014 | Cruz |

\* cited by examiner

| Frequency (MHz) | Decibel (dB) Reduction | Percentage Reduction |
|---|---|---|
| 800 | -41 | 99.10 |
| 1700 | -46 | 99.50 |
| 1900 | -29 | 96.45 |
| 2100 | -34 | 98.00 |
| 3000 | -18 | 87.40 |

FIG. 18

| Frequency (MHz) | Decibel (dB) Reduction | Percentage Reduction |
|---|---|---|
| 800 | -27 | 95.53 |
| 1700 | -22 | 92.06 |
| 1900 | -22 | 92.06 |
| 2100 | -23 | 92.92 |
| 3000 | -25 | 94.38 |

ELECTROMAGNETIC RADIATION SHIELDING TILE HAVING ELECTROMAGNETIC SHIELDING FABRIC AND METAL PORTIONS

CROSS REFERENCE TO RELATED PATENT APPLICATIONS

The present application is a national stage application of an international patent application PCT/US15/47016, filed Aug. 26, 2015, which claims priority to U.S. Provisional Application Ser. No. 62/081,118, filed on Nov. 18, 2014, entitled "EMF Blocking Laptop Skin/Tile," U.S. Provisional Application Ser. No. 62/064,931, filed on Oct. 16, 2014, entitled "Radiation Shielding Baby Blanket", and U.S. Provisional Application Ser. No. 62/043,047, filed on Aug. 28, 2014, entitled "Microwave Blocking Pocket Patch." These provisional applications are herein incorporated by reference in their entirety, and the benefit of the filing date of this application is claimed to the fullest extent permitted.

BACKGROUND

The use of portable computing systems and devices is becoming more and more common. As such, the amount of electromagnetic field (EMF) radiation in our environment has increased on pace. The proximity of individuals to some sources of EMF radiation has also increased. Portable computing devices are often carried when not in use and held during use despite manufacturer warning that the electromagnetic (EM) radiation may be harmful to humans and directing individuals to maintain a predetermined distance from the device when the device is enabled. Further, in some cases, long-term exposure or excessive exposure to EMFs may cause permanent damage.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical components or features.

FIG. 18 illustrates a graph showing the effectiveness of the EM radiation shielding tile of FIG. 1.

FIG. 19 illustrates a graph showing the effectiveness of the EM radiation shielding tile of FIG. 2.

DETAILED DESCRIPTION

Figure 1:
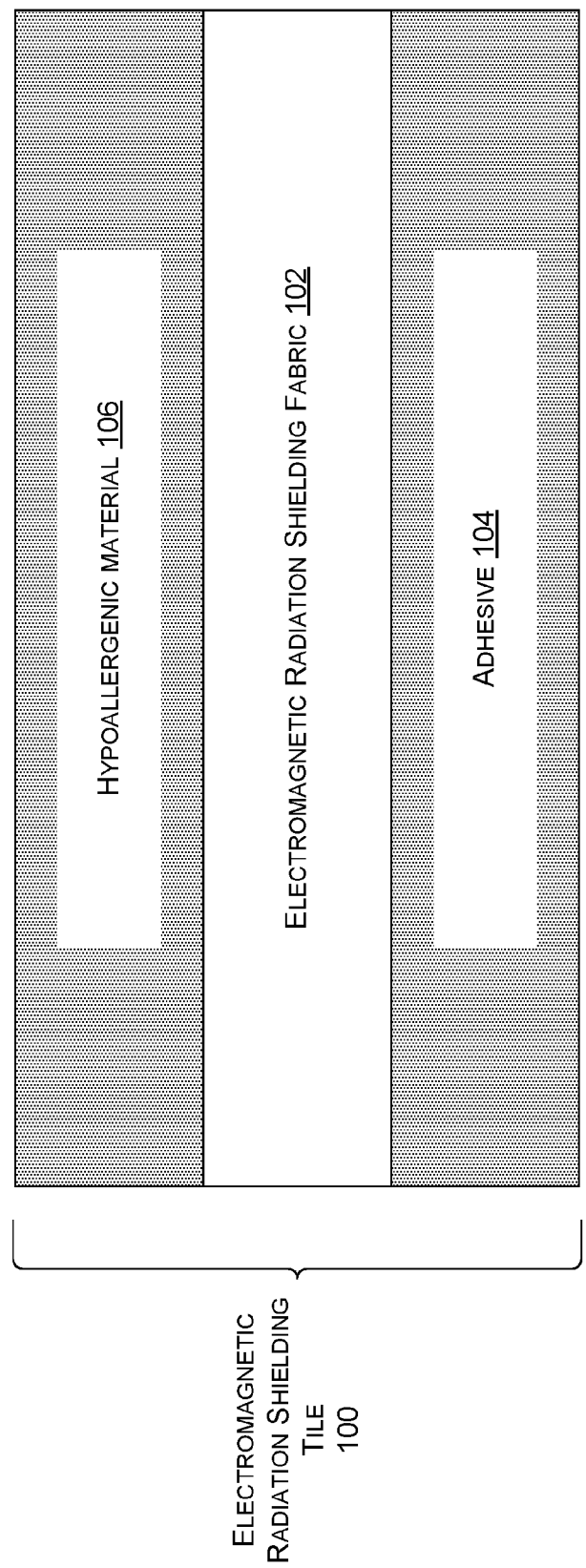
FIG. 1 illustrates a block diagram showing a cross-sectional view of an example electromagnetic radiation shielding tile according to some implementations.

This disclosure includes techniques and implementations to provide electromagnetic field (EMF) radiation shielding tiles. For example, many electronic devices, including mobile devices (such as cell phones, tablets, and laptop computers) emit EMF radiation while on. In some cases, the EMF radiation may be harmful to humans (such as during extended period of exposure). In fact, in some instances, the devices may be shipped with warnings recommending and/or instructing the user of the device to maintain a predetermined distance from the electronic device while the device is active. Unfortunately, many people today often carry devices (such as mobile phones or tablets) in their pockets or in close proximity to their bodies, while other users often place the devices such as laptops and tablet in their lap during use. Still other users may hold devices such as mobile phones against the user's head when speaking or conducting a phone conversation. In each of these cases, the user may be exposed to harmful EMF radiation that may have unknown side effects.

As described herein, EMF radiation includes both radio frequency waves and microwaves. For example, the EMF radiation may in some cases include radiation in the range of 3 kilohertz (kHz) to 300 Gigahertz (GHz). Additionally, in some cases, the EMF radiation tiles may also shield or absorb extremely low frequency (ELF) EMF. For example, the ELF radiation may be emitted by power lines, transformers, and/or some types of appliances. In some instances, the ELF radiation may be of the frequency 50 Hz or 60 Hz.

Thus, described herein are EM radiation shielding tiles, patches, and fabrics that may be applied to various surfaces (such as the interior pocket of a pair pants, the bottom of a laptop, etc.) to reduce a user exposure to the EMF radiation emitted by the user's everyday devices. For instance, in one implementation, the tile may include a layer of EM fabric over a layer of adhesive. In some cases, the EM radiation shielding fabric may include one or more of nickel, copper, silver, or cobalt combined with a cloth material, such as cotton, nylon, polyester, or other fabrics. The metal thread may be woven together with the fabric thread to deflect the EMF radiation generated by today's electronic devices in a manner similar to a Faraday cage or Faraday shield. In some particular implementations, the tile may also include a hypoallergenic material or layer applied to the opposite side of the EM radiation shielding fabric as the adhesive.

In other cases, the EM radiation shielding tile may be configured to include a protective layer (such as a laminate) applied to the opposite side of the EM radiation shielding fabric as the adhesive. For example, when the tile is designed to be applied to a surface of the electronic device itself, the protective layer or laminate may prevent the tile from peeling, chipping, or tearing in response to handling of the electronic device.

In still other cases, the EM radiation shielding fabric layer of the EM radiation shielding tile may be replaced by a mu metal layer or a microwave absorbing material layer. For example, the mu metal layer may also act to deflect or disperse the EMF radiation generated by an electronic device back in the direction from which the EMF radiation eliminated. In one particular example, the mu metal layer may include a nickel-iron alloy. For instance, in one example, the mu metal layer may be formed from approximately 80% nickel, 5% molybdenum, and small amounts of various other elements, such as silicon and iron.

Alternatively, the EM radiation shielding fabric may be replaced with the microwave absorbing material layer which may convert the EMF radiation into heat that may then be spread or dispersed without exposing the user to the potential negative consequences associated with the EMF radiation. For example, the tiles may be applied to the back of wall hangings or art to reduce EMF radiation spread by various smart appliances or in-home devices (such as lighting or air conditioner control mounts). For example, the wall art may be hung on the opposite side of a wall from the smart lighting controls to prevent EMF radiation from traveling through the wall and into other rooms. In some cases, the microwave absorbing material layer may be formed from carbon, foam, and/or various magnetic materials, among others components.

In some examples, the EM radiation shielding tiles may be formed having multiple EMF deflecting or absorbing layers. For instance, in some implementations, the tiles may include an EM radiation shielding fabric layer, a mu metal layer, and a microwave absorbing material. In other instances, the EM radiation shielding may include multiple layers and/or combinations of EM radiation shielding fabric, mu metal, and/or microwave absorbing material.

In one example, an EM blanket may be configured to include and EM radiation shielding tile sandwiched between layers of cloth (such as flannel). The EM radiation shielding tile within the blanket may include multiple layers of EM radiation shielding fabric and a layer of microwave absorbing material but not a layer of mu metal, as the mu metal layer may not be flexible enough for use in a blanket. In some cases, the microwave absorbing layer may act to warm the blanket by converting EMF radiation into heat which may be spread over the length of the blanket. In some cases, the EM blanket may also include one or more layers of hypoallergenic materials to protect individuals from adverse reaction with the PU-silver-copper thread associated with the EM radiation shielding fabric.

FIG. 1 illustrates a block diagram showing a cross-sectional view of an example electromagnetic radiation shielding tile 100 according to some implementations. In the illustrated example, the EM radiation shielding tile 100 may include a layer of EM radiation shielding fabric 102 over a layer of adhesive 104. In some cases, metal thread (nickel, copper, silver, cobalt or a combination thereof) may be woven together with the fabric thread to deflect the EMF radiation generated by today's electronic devices in a manner similar to a Faraday cage or Faraday shield. For instance, the EM radiation shielding fabric 102 may include deflect up to 99% of EMF radiation generated by an electronic device. The EM radiation shielding fabric 102 may also include a cotton or nylon fiber thread. In some cases, the thread may be a gossamer-thin 0.02 mm silvered and PU coated spun-in copper thread. In some instances, the ratio of silver-PU-copper thread to cotton may be 1 to 9. In other words, in one example, the EM radiation shielding fabric 102 may be formed from 90% cotton fiber and 10% PU-silver-copper thread.

In some cases, the EM radiation shielding fabric 102 may be a hypoallergenic material to prevent adverse reaction between skin and the silver-PU-copper thread. However, such as in the illustrated example, the EM radiation shielding tile 100 may also include a hypoallergenic material or layer 106 applied to the opposite side of the EM radiation shielding fabric 102 as the adhesive 104. For instance, in the illustrated example, the hypoallergenic layer 106 is positioned atop the EM radiation shielding fabric 102, which in turn is positioned atop the adhesive layer 104. In this instance, the bottom layer or the adhesive 104 may be applied to another article (such as clothing) leaving the top layer or the hypoallergenic layer 106 exposed to the environment.

In some cases, the adhesive 104 may be a powder adhesive that is activated upon exposure to heat or UV radiation. For example, the adhesive 104 may be combined with the EM radiation shielding fabric 102 via a heat and roll process or a spray/sprinkle (such as sputtering) followed by an application of heat. In some cases, the heat may be applied in a factory by the manufacture to bond the adhesive layer 104 to the EM radiation shielding fabric 102 and a second application of heat may be applied by an consumer at home (via, for instance, an iron or hairdryer) to bond the EM radiation shielding tile 100 to an object or other article (such as clothing). In other cases, the adhesive 104 may be a one-time stick or non-chemical binding adhesive, such as a peel and place sticker. In some cases, the peel and place sticker may include an adhesive 104 that allows for removal and re-application of the tile to another article.

Figure 2:
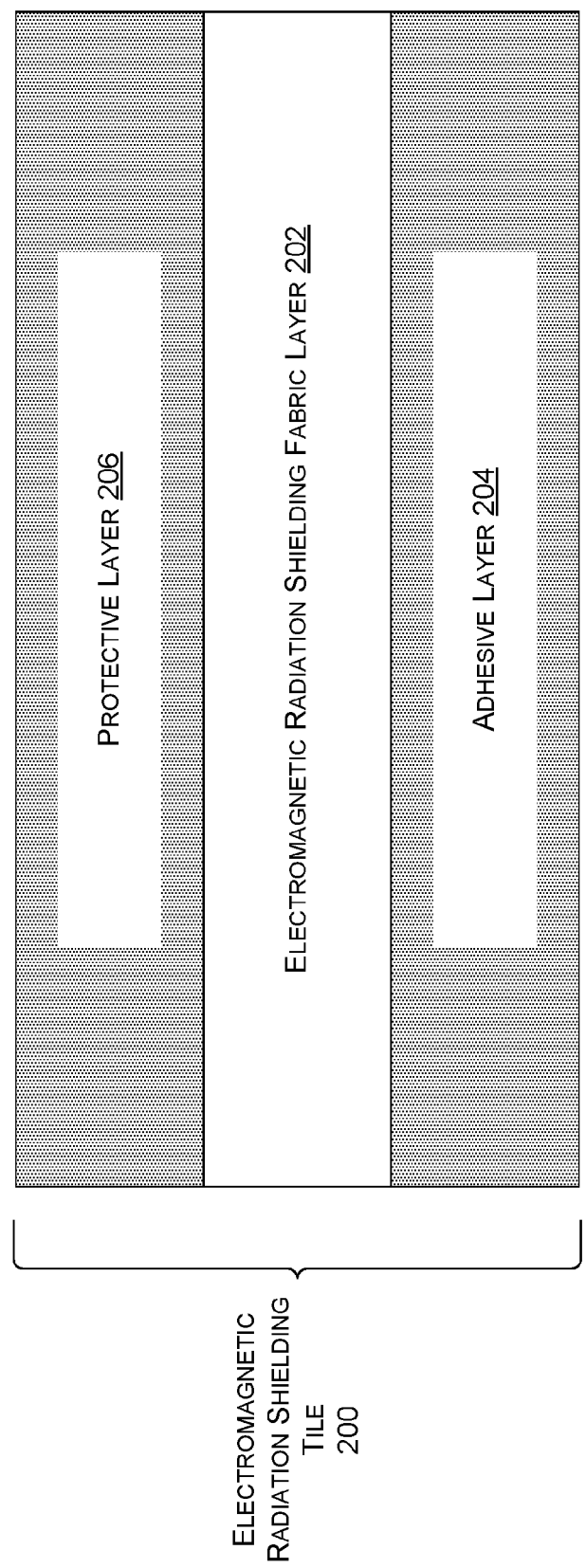
FIG. 2 illustrates another block diagram showing a cross-sectional view of an example electromagnetic radiation shielding tile according to some implementations.

FIG. 2 illustrates another block diagram showing a cross-sectional view of an example EM radiation shielding tile 200 according to some implementations. For instance, in some cases (such as on the backside of an electronic device), a hard or firm EM radiation shielding tile 200 may be more applicable than the flexible or fabric like EM radiation shielding tile 100 described above. In the illustrated example, the EM radiation shielding tile 200 may include a layer of EM radiation shielding fabric 202 over a layer of adhesive 204. As described above, in some cases, the EM radiation shielding fabric 202 may include a copper/silver thread that is woven together with a portion of cotton thread to deflect the EMF radiation generated by today's electronic devices in a manner similar to a Faraday cage or Faraday shield. For instance, in one particular example, the EM radiation shielding fabric 202 may include a cotton fiber threaded with a gossamer-thin 0.02 mm silvered and PU coated spun-in copper thread. In some instances, the ratio of silver-PU-copper thread to cotton may be 1 to 9. In other words, in one example, the EM radiation shielding fabric 202 may be formed from 90% cotton fiber and 10% PU-silver-copper thread.

The adhesive 204 may be a powder adhesive that is activated upon exposure to heat or UV radiation. In other cases, the adhesive layer 204 may be formed by an adhesive film, gel, paste, or tape. For example, the adhesive 204 may be combined with the EM radiation shielding fabric 102 via a heat and roll process or a spray/sprinkle (such as sputtering) followed by an application of heat. In some cases, the heat may be applied in a factory by the manufacture to bond the adhesive layer 204 to the EM radiation shielding fabric 202 and a second application of heat may be applied by an consumer at home (via, for instance, an iron or hairdryer) to bond the EM radiation shielding tile 200 to an object or other article (such as clothing). In other cases, the adhesive 204 may be applied via a roller at a pressure. In other cases, the adhesive 204 may be a one-time stick or non-chemical binding adhesive, such as a peel and place sticker.

In the illustrated example, a protective layer 206 is applied over the top surface of the EM radiation shielding fabric 202. For example, the protective layer 206 may be a laminate that is applied to the top surface of the EM radiation shielding fabric via a lamination process such as a roll to roll process or a vacuum compression process. In some cases, the laminate may be formed from vinyl, polymer, plastic, polycarbonate, polyester, among others. For instance, the EM radiation shielding tile 200 may be laminated in a vacuum under a pressure of 50 Pascal (Pa) or less for 20 to 30 seconds. In another example, a roll-to-roll lamination process may be performed on the EM radiation shielding tile 200, for example, while a temperature included in a range of about 15° C. to about 40° C. is applied via a heat lamp. In some cases, the heat and external force may be applied to the EM radiation shielding tile 200 in an autoclave chamber at pressure included in a range of about 10 Pa to about 300 Pa for 20 to 50 seconds. In one implementation, the EM radiation shielding tile 200 may be produced by heating the layers 202 and 206 at a temperature included in a range of about 25° C. to about 80° C., while pressure is applied. In another instance, the EM radiation shielding tile 200 may be produced by heating at a temperature included in a range of about 40° C. to about 60° C.

In other examples, when using a stiff or rigid EM radiation shielding tile 200, the EM radiation shielding fabric 202 may be replaced with other materials. For example, FIGS. 3 and 4 below provide some alternative EM radiation shielding tiles formed from different materials.

Figure 3:
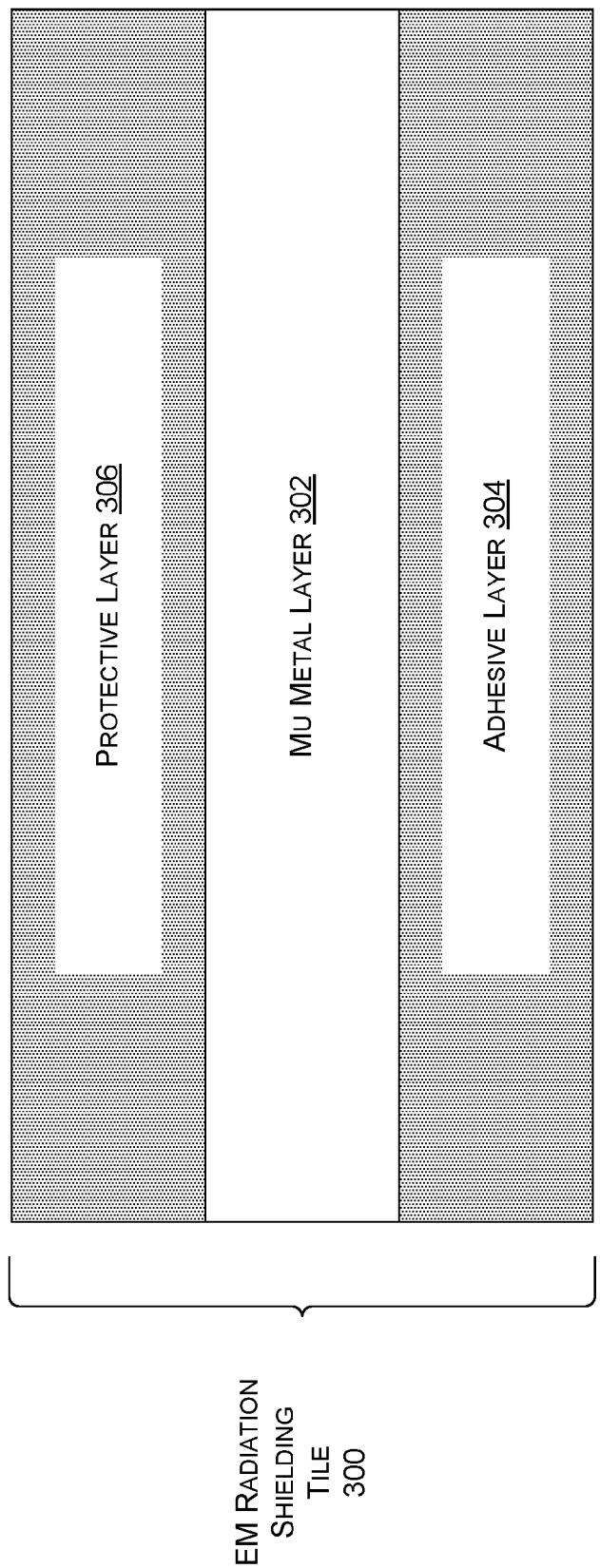
FIG. 3 illustrates another block diagram showing a cross-sectional view of an example electromagnetic radiation shielding tile according to some implementations.

FIG. 3 illustrates another block diagram showing a cross-sectional view of an example EM radiation shielding tile 300 according to some implementations. In the illustrated example, the EM radiation shielding tile 300 includes a mu metal layer 302 sandwiched between an adhesive layer 304 and a protective layer 306. The mu metal layer 302 may also act to deflect or disperse EMF radiation generated by an electronic device back in the direction from which the EMF radiation eliminated. In one particular example, the mu metal layer 302 may include a nickel-iron alloy. For instance, in one example, the mu metal layer 302 may be formed from approximately 80% nickel and 5% molybdenum with the remainder formed from various amounts of other elements, such as silicon and iron.

As described above, the adhesive 304 may be a powder adhesive that is activated upon exposure to heat or UV radiation. In other cases, the adhesive layer 304 may be formed by an adhesive film, gel, paste, or tape (such as a quick release paper adhesive or a barrier film adhesive). For example, the adhesive 304 may be combined with the mu metal 302 via a heat and roll process. In some cases, the heat may be applied in a factory by the manufacture to bond the adhesive layer 304 to the mu metal 302 and a second application of heat may be applied by an consumer at home (via, for instance, an iron or hairdryer) to bond the EM radiation shielding tile 300 to an object or other article (such as clothing). In other cases, the adhesive 304 may then be applied by a user via a one-time stick or non-chemical binding adhesive, such as a peel and place sticker.

In the illustrated example, a protective layer 306 is applied over the top surface of mu metal 302. For example, the protective layer 306 may be a laminate that is applied to the top surface of the mu metal 302 via a lamination process such as a roll to roll process or a vacuum compression process. In some cases, the laminate may be formed from vinyl, polymer, plastic, polycarbonate, and polyester, among others. For instance, the EM radiation shielding tile 300 may be laminated in a vacuum under a pressure or via a pair of stacked rollers.

Figure 4:
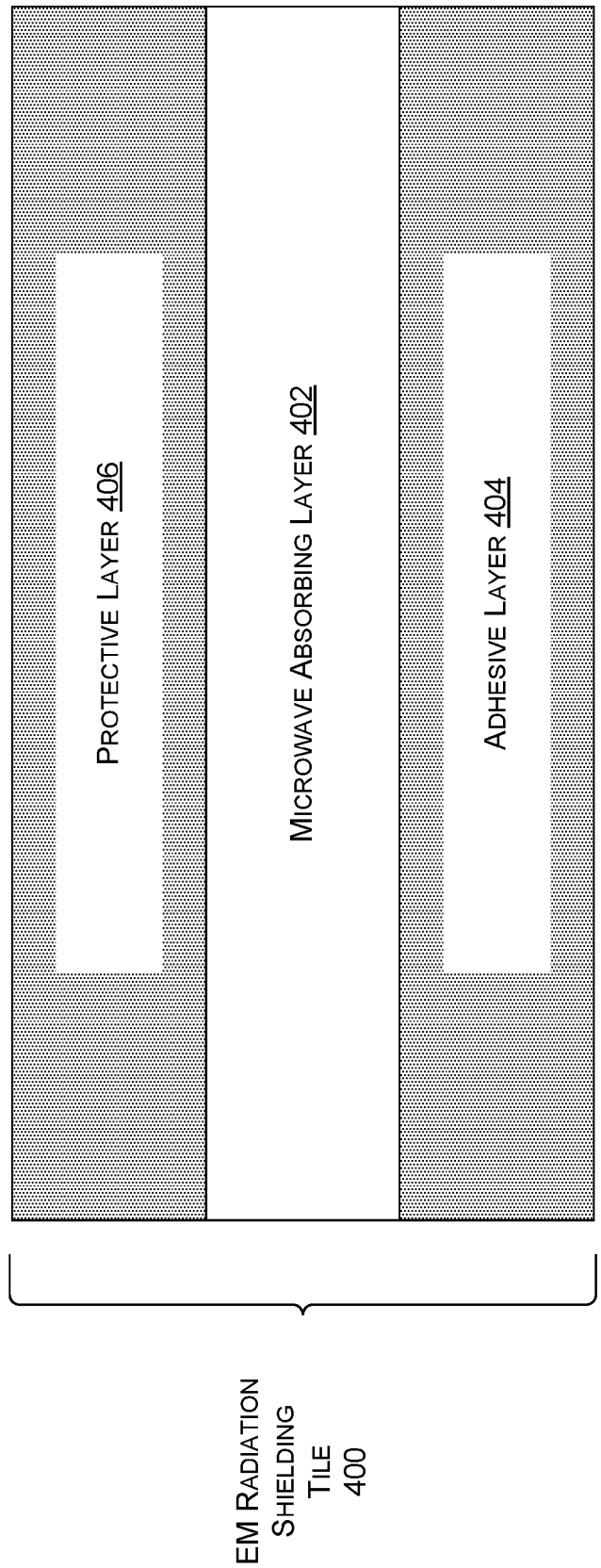
FIG. 4 illustrates yet another block diagram showing a cross-sectional view of an example electromagnetic radiation shielding tile according to some implementations.

FIG. 4 illustrates another block diagram showing a cross-sectional view of an example EM radiation shielding tile 400 according to some implementations. In the illustrated example, the EM radiation shielding tile 400 includes a microwave absorbing layer 402 sandwiched between an adhesive layer 404 and a protective layer 406. The microwave absorbing material layer may convert the EMF radiation into heat rather than deflecting the radiation back in the direction of emittance. The heat may then be spread or dispersed without exposing the user to the potential negative consequences associated with the EMF radiation. For example, the EM radiation shielding tile 400 may be applied to the back of wall hangings or art to reduce EMF radiation spread by various smart appliances or in-home device (such as lighting or air conditioner control mounts). For example, the wall art may be hung on the opposite side of a wall from the smart lighting controls to prevent EMF radiation from traveling through the wall and into other rooms. In some cases, the microwave absorbing material layer may be formed from carbon, foam, magnetic materials, among others.

As described above, the adhesive 404 may be a powder adhesive that is activated upon exposure to heat or UV radiation. In other cases, the adhesive layer 404 may be formed by an adhesive film, gel, paste, or tape. For example, the adhesive 404 may be combined with the microwave absorbing layer 402 via a heat and roll process. In some cases, the heat may be applied in a factory by the manufacture to bond the adhesive layer 404 to the microwave absorbing layer 402 and a second application of heat may be applied by an consumer at home (via, for instance, an iron or hairdryer) to bond the EM radiation shielding tile 400 to an object or other article (such as clothing). In other cases, the adhesive 404 may then be applied by a user via a one-time stick or non-chemical binding adhesive, such as a peel and place sticker.

In the illustrated example, a protective layer 406 is applied over the top surface of the microwave absorbing layer 402. For example, the protective layer 306 may be a laminate that is applied to the top surface of the microwave absorbing layer 402 via a lamination process such as a roll to roll process or a vacuum compression process. In some cases, the laminate may be formed from vinyl, polymer, plastic, polycarbonate, and polyester, among others. For instance, the EM radiation shielding tile 400 may be laminated in a vacuum under a pressure or via a pair of stacked rollers.

FIGS. 1-4 illustrate various EM radiation shielding tiles 100-400 showing a single layer of EM radiation shielding/absorbing material. However, in some cases, such as shown below with respect to FIGS. 5-7, multiple layers of different types of EM radiation shielding/absorbing materials may be utilized.

Figure 5:
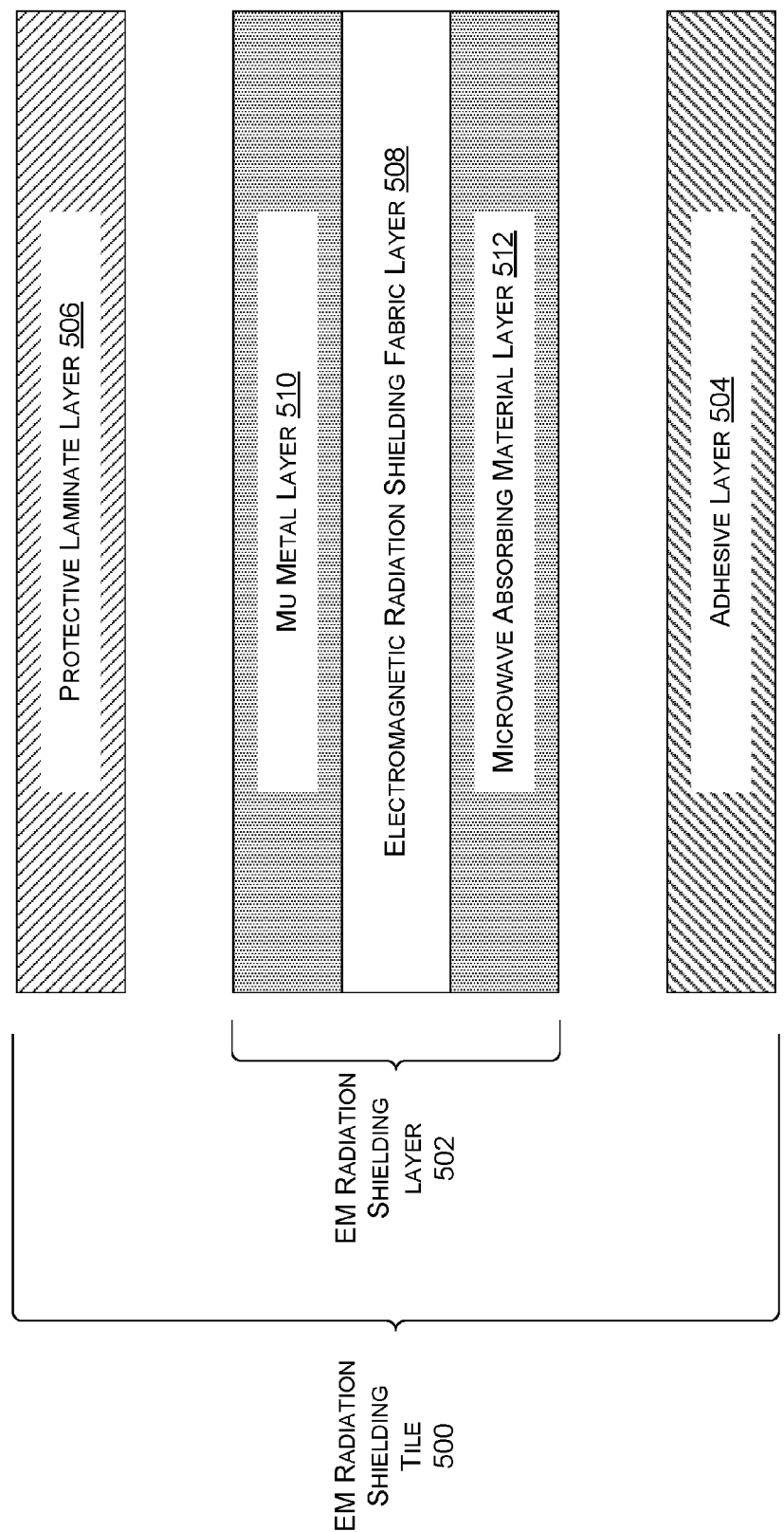
FIG. 5 illustrates a block diagram showing a cross-sectional view of an example electromagnetic radiation shielding tile having multiple EM layers according to some implementations.

FIG. 5 illustrates a block diagram showing a cross-sectional view of an example EM radiation shielding tile 500 having multiple EM layers according to some implementations. In the illustrated example, the EM radiation shielding tile 500 includes an EM radiation shielding layer 502 between an adhesive layer 504 and a protective laminate layer 506, as described above. The EM radiation shielding layer 502 in turn includes multiple layers 508, 510, and 512 that act to absorb, reflect, and deflect EMF radiation.

For instance, in the illustrated example, the EM radiation shielding layer 502 includes an EM fabric layer 508, a mu metal layer 510, and a microwave absorbing material layer 512. In this example, the EM fabric layer 508 and the mu metal layer 510 may be configured to deflect the EMF radiation while the microwave absorbing layer 512 may be configured to convert the EMF radiation into heat, as described above. In the illustrated example, the mu metal layer 510 is shown atop the EM fabric layer 508 that is atop the microwave absorbing material layer 512. However, one of ordinary skill in the art will understand that the layers 508, 510, and 512 as described herein may be arranged in a number of various configurations.

In some cases, the EM fabric layer 508, the mu metal layer 510, and the microwave absorbing materiel layer 512 may be combined via a powder adhesive or an adhesive tape (such as a quick release paper adhesive or a barrier film adhesive). For example, the powder may be applied to a surface of the EM fabric and the mu metal may be contacted with the adhesive as heat is applied. In other cases, the EM fabric layer 508, the mu metal layer 510, and the microwave absorbing materiel layer 512 may be laminated or even sewn together.

Figure 6:
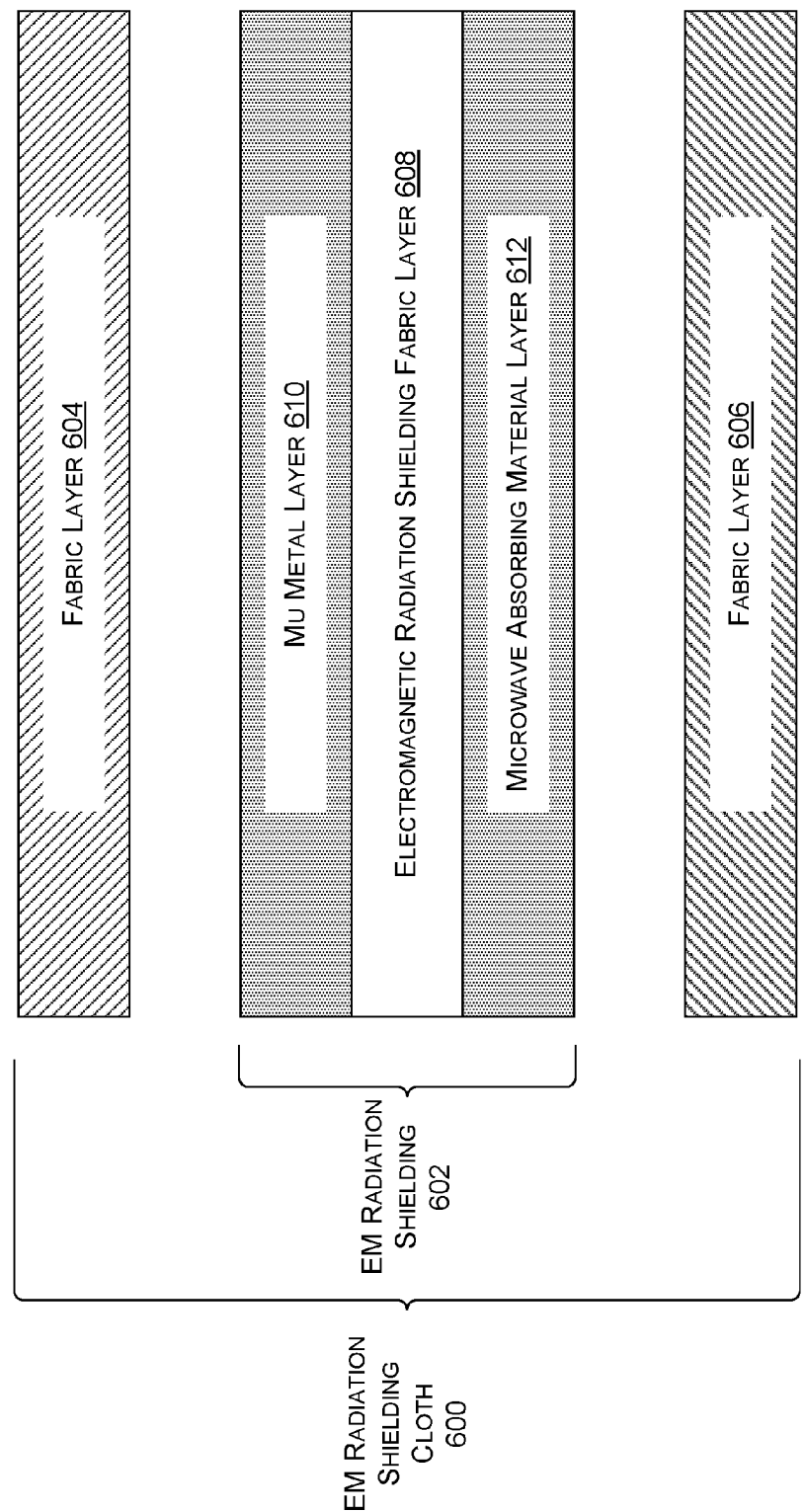
FIG. 6 illustrates another block diagram showing a cross-sectional view of an example electromagnetic radiation shielding tile having multiple EM layers according to some implementations.

FIG. 6 illustrates a block diagram showing a cross-sectional view of an example EM radiation shielding cloth 600 having multiple EM layers according to some implementations. In the illustrated example, the EM radiation shielding cloth 600 includes an EM radiation shielding layer 602 between two layers of fabric 604 and 606 (such as cotton, denim, or flannel). Thus, the EM radiation shielding cloth 600 may be incorporated into clothing, blankets, backpacks, bags, or other cloth or cloth like articles to provide EM protection. For instance, the EM radiation shielding cloth 600 may be used as a flannel blanket to protect for example a swaddled child, to line the inside of a backpack to protect the wearer from EMF radiation of a device within the backpack, or within jeans to provide protection along the leg of the user. In some cases, the EM radiation shielding cloth 600 may run the entirety of the article while in other examples the EM radiation shielding cloth 600 may be isolated to a portion of the article (such as along the backside of a backpack). For example, the thickness, extent, and placement of the EM radiation shielding cloth 600 may be selected based at least in part on the intended use of the case 600 and/or of the device placed within the case 600 (for example, if the device utilizes wireless communication some portion of the case 600 should be EM radiation shielding free).

The EM radiation shielding layer 602 in turn includes multiple layers 608, 610, and 612 that act to absorb, reflect, and deflect EMF radiation. For instance, in the illustrated example, the EM radiation shielding layer 602 includes an EM fabric layer 608, a mu metal layer 610, and a microwave absorbing material layer 612. In this example, the EM fabric layer 608 and the mu metal layer 610 may be configured to deflect the EMF radiation while the microwave absorbing layer 612 may be configured to convert the EMF radiation into heat, as described above. In the illustrated example, the mu metal layer 610 is shown atop the EM fabric layer 608 that is atop the microwave absorbing material layer 612. However, it should be understood that the layers 608, 610, and 612 may be arranged in various configurations.

Figure 7:
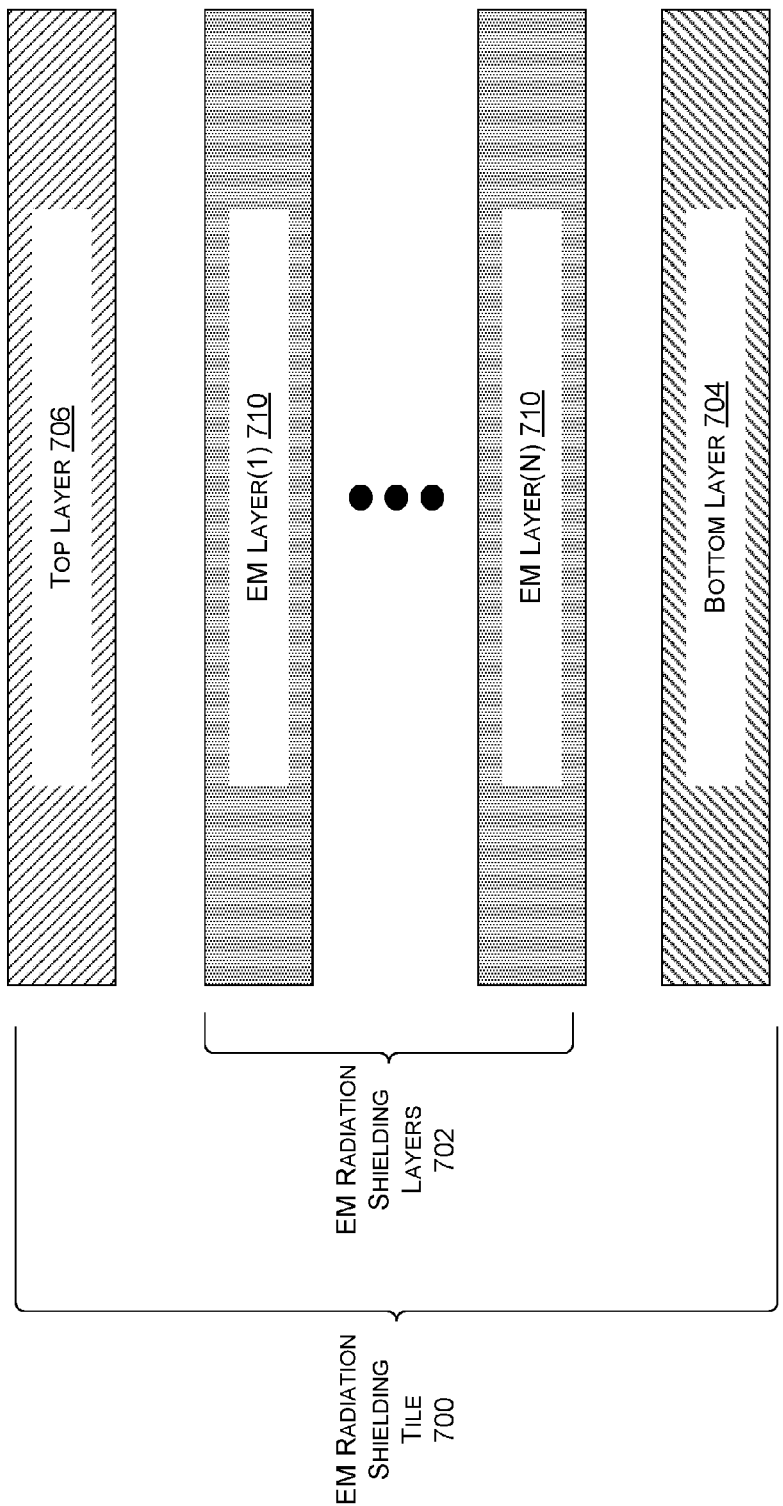
FIG. 7 illustrates yet another block diagram showing a cross-sectional view of an example electromagnetic radiation shielding tile having multiple EM layers according to some implementations.

FIG. 7 illustrates yet another block diagram showing a cross-sectional view of an example EM radiation shielding tile 700 having multiple EM layers according to some implementations. The EM radiation shielding tile 700 includes an EM radiation shielding layer 702 between an adhesive layer or a bottom layer 704 and a protective layer or a top layer 706. However, as shown in FIG. 6 above, the bottom layer 704 and the top 706 may be replaced with fabric layers in some implementations to form an EM radiation shielding cloth.

The EM radiation shielding layer 702 in turn includes multiple layers 710(1)-710(N) that act to absorb, reflect, and/or deflect EMF radiation. For instance, the EM radiation shielding layer 702 may include one or more layers of EM radiation shielding fabric, a mu metal, and/or microwave absorbing material. In one example, the EM radiation shielding layer 702 may include six or more alternating layers of EM radiation shielding fabric, mu metal, and microwave absorbing material. In some instances, the EM radiation shielding tile 700 may be tuned to block particular frequencies and/or amounts of radiation by selecting particular types of layers and by varying the thickness of each layer.

Figure 8:
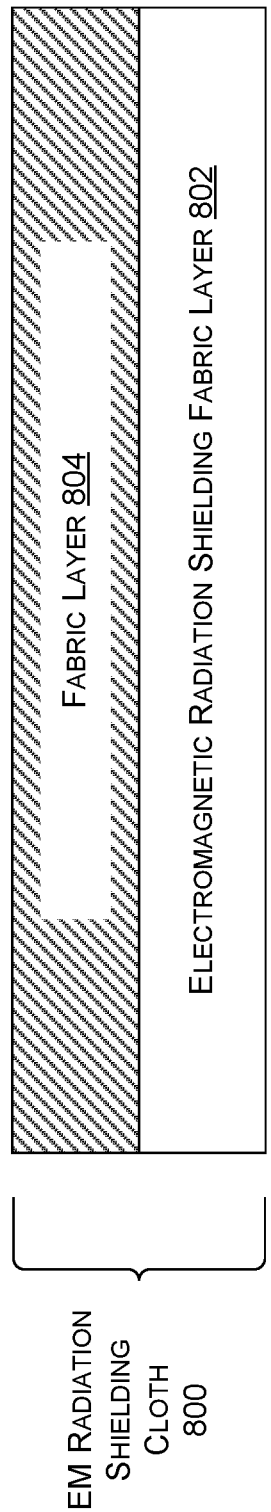
FIG. 8 illustrates another block diagram showing a cross-sectional view of an example electromagnetic radiation shielding cloth according to some implementations.

FIG. 8 illustrates another block diagram showing a cross-sectional view of an example electromagnetic radiation shielding cloth according to some implementations. The EM radiation shielding cloth 800 includes an EM radiation shielding layer 802 contacted to a fabric layer 804. Thus, the EM radiation shielding cloth 800 may be incorporated into clothing, blankets, backpacks, bags, or other cloth or cloth like articles to provide EM protection. For instance, the EM radiation shielding cloth 800 may be used as a flannel blanket to protect for example a swaddled child, to line the inside of a backpack to protect the wearer from EMF radiation of a device within the backpack, or within jeans to provided protection along the leg of the user. In some cases, the EM radiation shielding cloth 800 may run the entirety of the article while in other examples the EM radiation shielding cloth 800 may be isolated to a portion of the article (such as along the backside of a backpack).

In the illustrated example, the EM fabric layer 802 may be a hypoallergenic fabric, as the EM fabric 802 may be exposed to a human. However, by only including one layer of fabric 804, the overall thickness of the EM radiation shielding cloth 800 may be reduced, thereby reducing costs and allowing for a wider range of applications, such as for light weight clothing. For example, the fabric layer 804 may include nylon or another breathable material.

Figure 9:
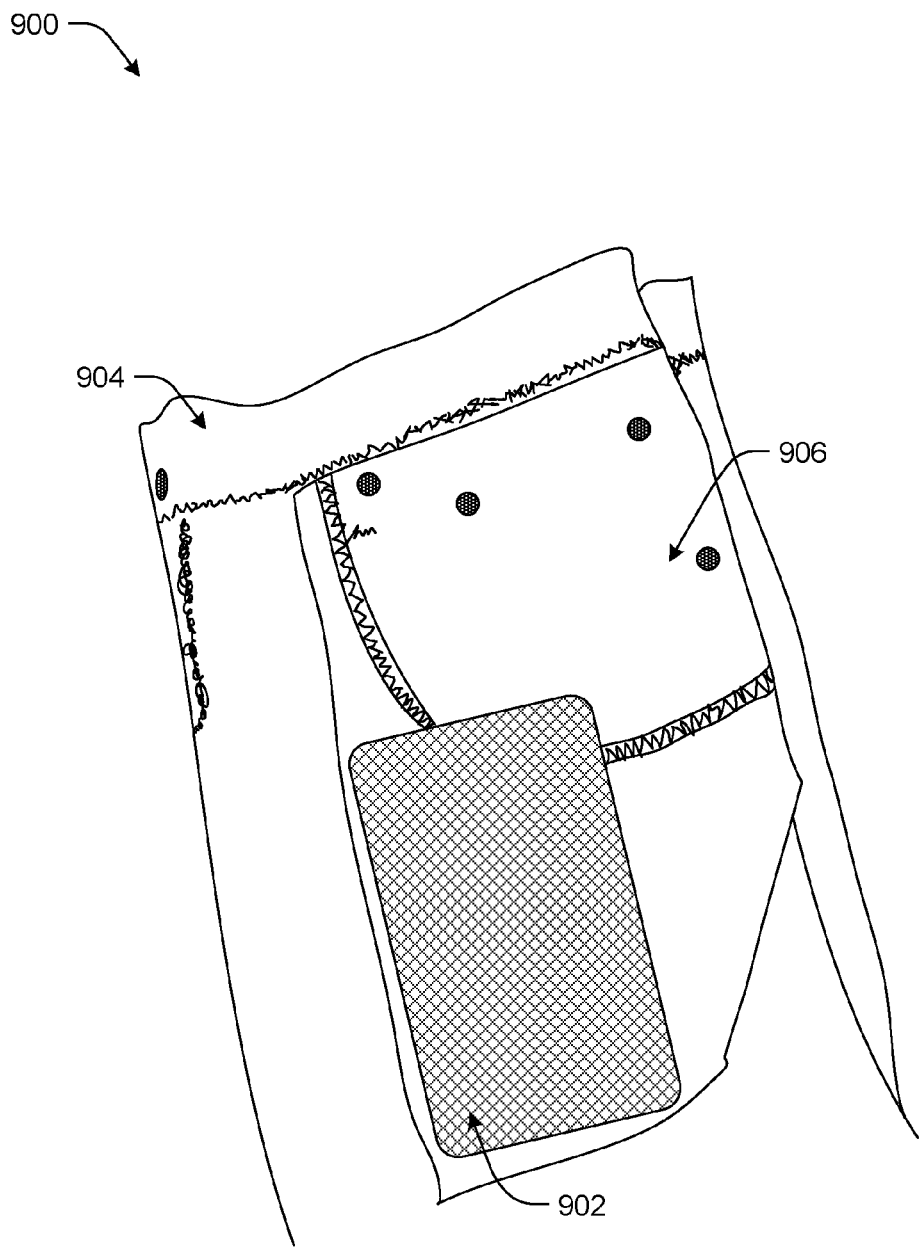
FIG. 9 illustrates a diagram showing an example use of an electromagnetic shielding tile on clothing according to some implementations.

FIG. 9 illustrates a diagram 900 showing an example use of an electromagnetic shielding tile 902 on clothing (such as the pair of pants 904) according to some implementations. In this example, the pants 904 are shown as inside-out, exposing the interior lining of a pocket 906. The EM radiation shielding tile 902 is shown as applied to the front bottom corner of the pocket 906 in a manner that would deflect EMF radiation away from the leg of an individual wearing the pants 904. For instance, if the individual wearing the pants 904 placed a mobile phone within the pocket 906. The phone would be positioned opposite the EM radiation shielding tile 902 within the pocket 906, such that the EM radiation shielding tile 902 would be between the phone and the individual's leg.

In some implementations, the EM radiation shielding tile 902 or patch may be applied to the pocket 906 as an aftermarket item. In these cases, the EM radiation shielding tile 902 may include an adhesive layer as described above with respect to FIGS. 1-5. In the illustrated example, the EM radiation shielding tile 902 may include a peel and place adhesive, such that the individual may peel a cover placed over the adhesive layer to expose the adhesives, align the EM radiation shielding tile 902 with the pocket 906, and place the EM radiation shielding tile 902 by applying pressure to both the EM radiation shielding tile 902 and the pocket 906.

Figure 10:
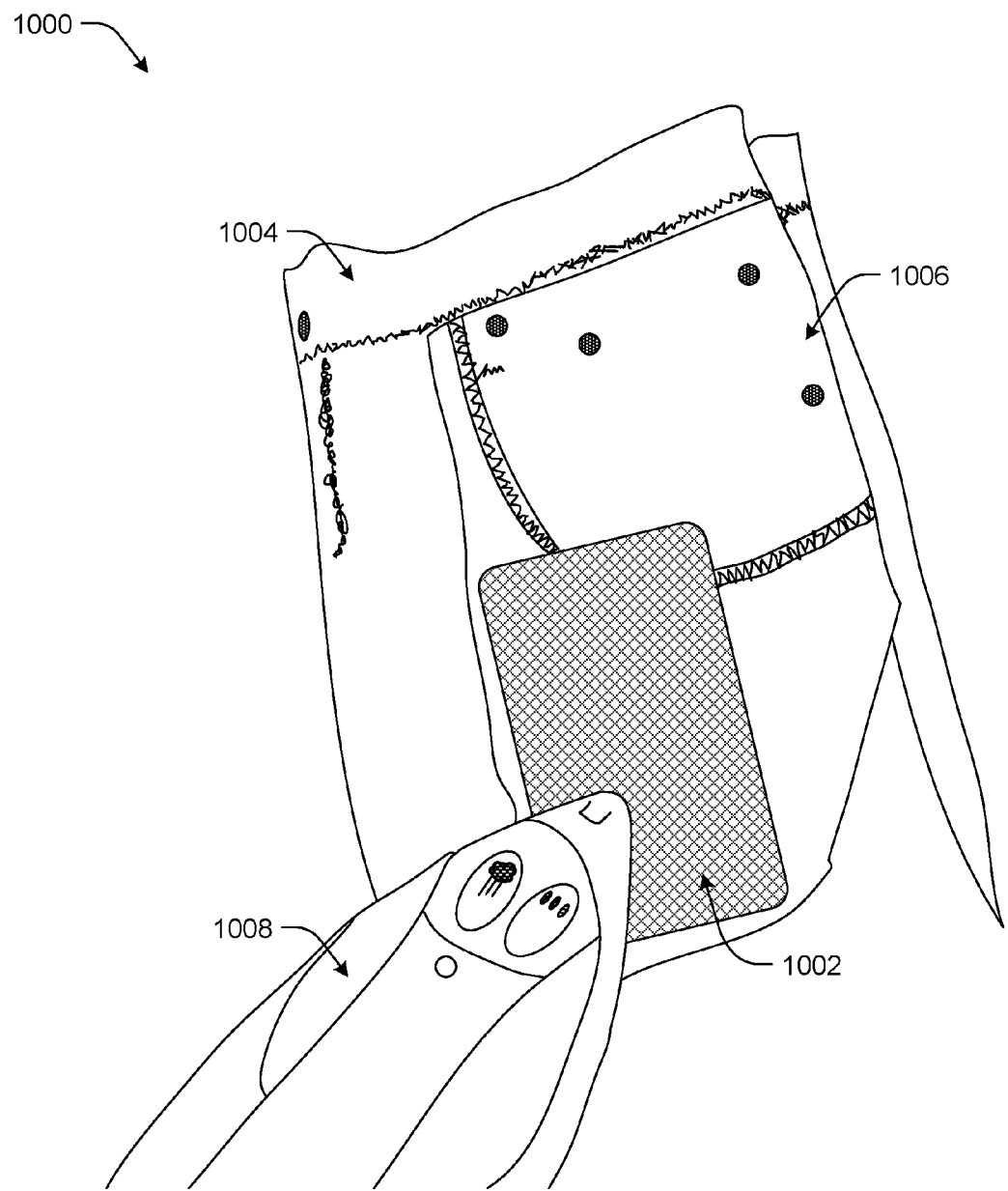
FIG. 10 illustrates another diagram showing an example use of an electromagnetic shielding tile on clothing according to some implementations.

FIG. 10 illustrates another diagram 1000 showing an example use of an electromagnetic shielding tile 1002 on clothing (such as a pair of pants 1004) according to some implementations. Similar to FIG. 9 above, the pants 1004 are shown as inside out exposing the interior lining of a pocket 1006. The EM radiation shielding tile 1002 is shown being applied to the front bottom corner of the pocket 1006 in a manner that would deflect EMF radiation away from the leg of an individual wearing the pants 1004. For instance, if the individual wearing the pants 1004 placed a mobile phone within the pocket 1006. The phone would be positioned opposite the EM radiation shielding tile 1002 within the pocket 1006, such that the EM radiation shielding tile 1002 would be between the phone and the individual's leg.

In some cases, the EM radiation shielding tile 1002 or patch may be applied to the pocket 1006 as an aftermarket item. For instance, in the illustrated example, the EM radiation shielding tile 1002 may include an adhesive layer as described above with respect to FIGS. 1-5. In this case, the adhesive may be applied via the introduction of heat to the EM radiation shielding tile 1002. Thus, in the current example, an iron 1008 is shown applying heat to the EM radiation shielding tile 1002 to cause the adhesive to activate and bond to the pocket 1006. While the iron 1008 is shown in the illustrated example, it should be understood that other devices may be utilized to apply heat to the EM radiation shielding tile 1002, such as a blow dryer.

Figure 11:
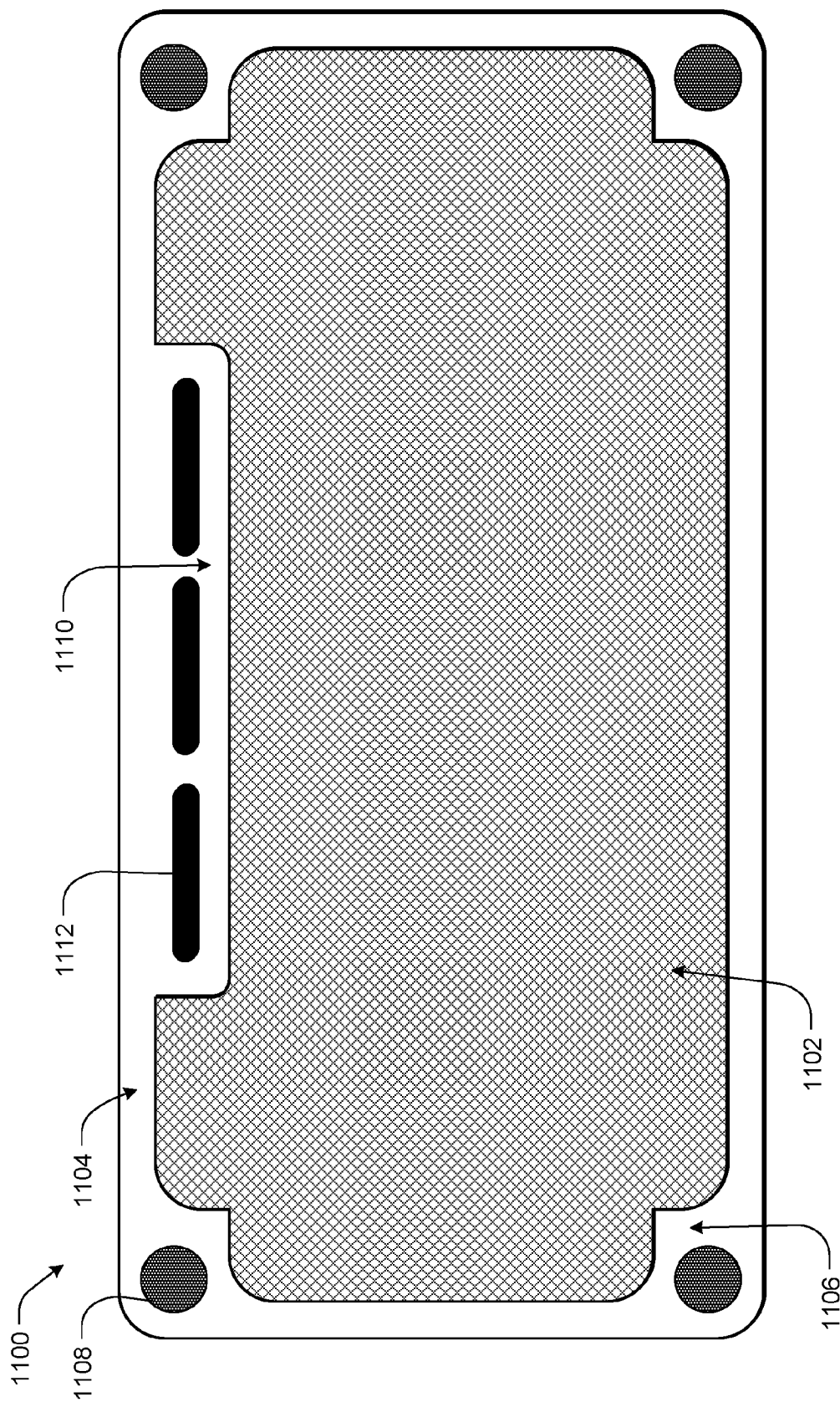
FIG. 11 illustrates a diagram showing an example use of an electromagnetic shielding tile on an electronic device according to some implementations.

FIG. 11 illustrates a diagram 1100 showing an example use of an electromagnetic shielding tile 1102 on an electronic device 1104 according to some implementations. For example, the EM radiation shielding tiles 1102 may be applied to one or more sides of various electronic devices, such as electronic device 1104, to protect the users from the EMF radiation. Thus, in the present example, the EM radiation shielding tile 1102 is shown contacted to the bottom surface of a notebook computer 1104. In this case, when the notebook computer is placed on a user's lap the overall exposure to the EMF radiation may be reduced by deflecting the EMF radiation away from the user.

In some cases, the EM radiation shielding tile 1102 may be cut by either the user or by a manufacture to accommodate various features of the electronic device. For instance, in the current example, the EM radiation shielding tile 1102 includes removed corner portions, generally indicated by 1106, to accommodate the footers 1108 of the electronic device 1004. The EM radiation shielding tile 1102 also includes a second removed portion, generally indicated by 1110, to accommodate multiple air vents 1112 of the electronic device 1104.

While the current example shows the EM radiation shielding tile 1102 applied to the bottom surface of a notebook computer 1104, in other instances, the EM radiation shielding tile 1102 may be applied to various other electronic devices. For example, the EM radiation shielding tile 1102 may be applied to one or more sides of an electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth.

Figure 12:
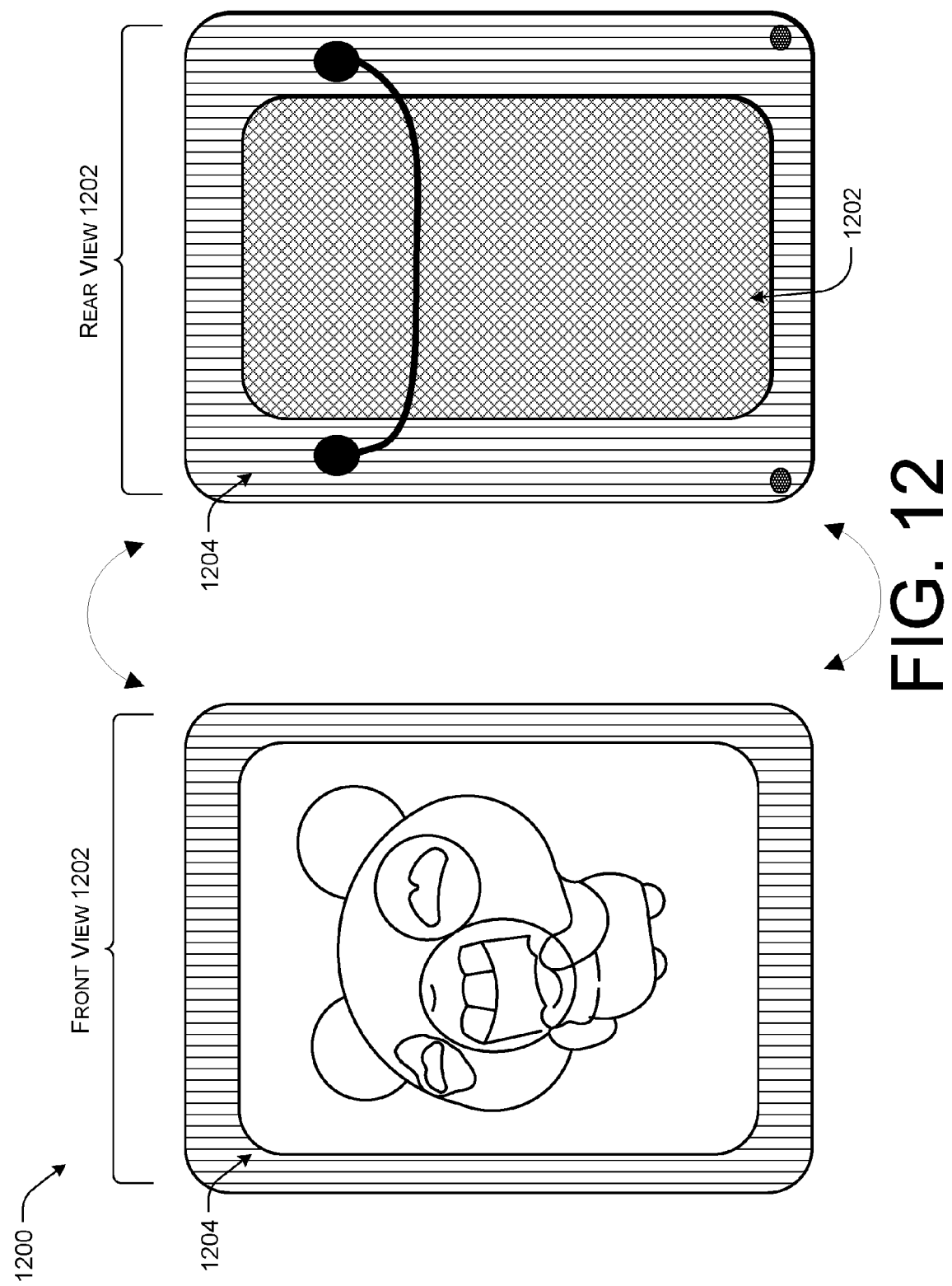
FIG. 12 illustrates a diagram showing an example use of an electromagnetic shielding tile on a picture frame according to some implementations.

FIG. 12 illustrates a diagram 1200 showing an example use of an electromagnetic shielding tile 1202 on a picture frame 1204 according to some implementations. In the illustrated example, the frame 1204 is shown both with a front view 1206 and a rear view 1208. The front view 1206 includes the frame portion and a photograph, while the rear view 1208 includes the EM radiation shielding tile 1202. Thus, the frame 1204 may be positioned on a wall opposite, for example, a smart thermostat or other wireless enable device. By placing the EM radiation shielding tile 1202 and/or the frame 1204 on the wall the amount of EMF radiation within a home may be reduces as the EMF radiation generated by the smart thermostat may be absorbed and converted to heat, as described above with respect to FIG. 4. Further, by applying to the rear side 1208 of the frame 1204, the EM radiation shielding tile 1202 may be hidden from view, leaving the pleasing artwork visible.

Figure 13:
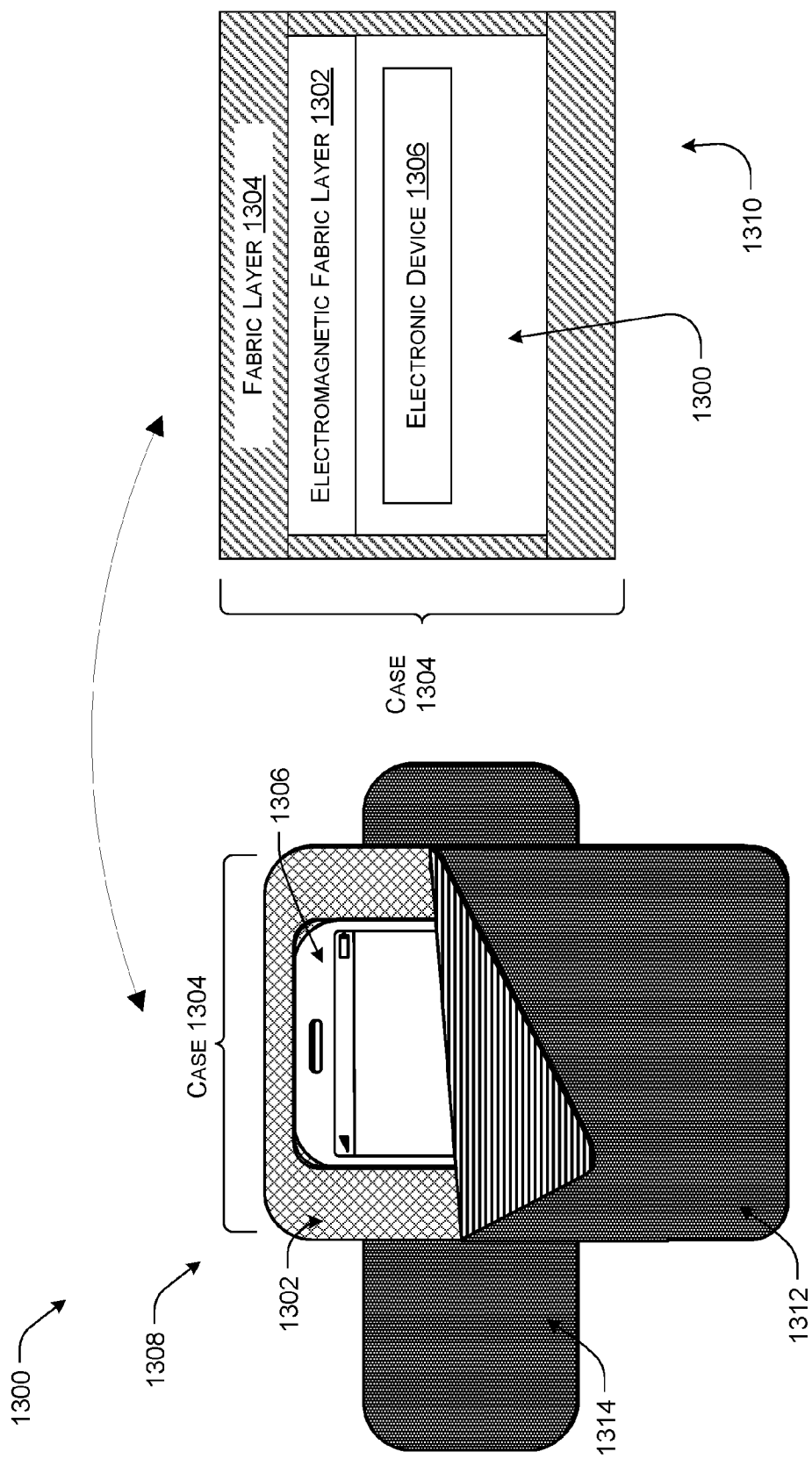
FIG. 13 illustrates a diagram showing an example use of an electromagnetic shielding tile on a case for an electronic device according to some implementations.

FIG. 13 illustrates a diagram 1300 showing an example use of an electromagnetic shielding tile 1302 or cloth on case 1304 for an electronic device 1306 according to some implementations. The illustrated example, includes a side view 1308 and a top view 1310. As shown in the side view 1308, the case 1304 includes a smart phone holder portion 1312 plus a belt portion 1314. In other examples, the case 1304 may be snapped, hooked, latched, or otherwise connected to various articles for transport. In this example, the holder 1312 is lined on one side with the EM radiation shielding tile 1302. Thus, the case 1304 may be worn on a person such that the EM radiation shielding tile 1302 or cloth may be positioned between the user and the phone 1306. However, by lining only the side facing the wearer, the phone 1306 may continue to receive wireless communication via the front of the device. For example, as shown in the top view 1310, the case 1304 includes a fabric layer 1316 with the EM fabric layer 1302 applied to one side. The fabric layer 1316 may also include an opening, generally indicated by 1318, for receiving the electronic device 1306. In the current example, a case 1304 for a smart phone 130, however, the EM radiation shielding tile 1302 or cloth may be utilized in various other types of cases. For example, the EM radiation shielding tile 1302 or cloth may be used to line one side of a brief case, laptop carrying case, backpack, among others.

Figure 14:
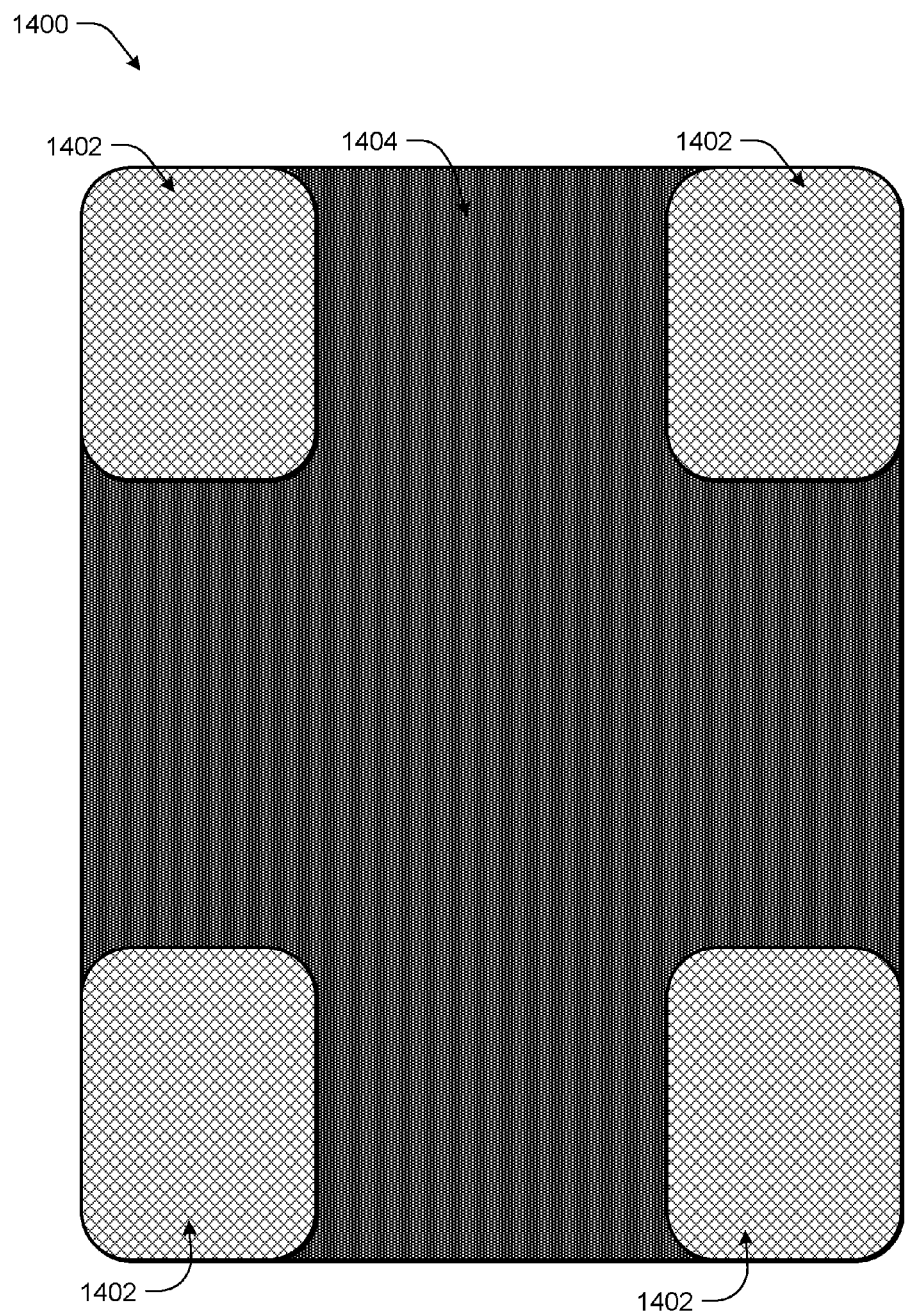
FIG. 14 illustrates a diagram showing an example use of an electromagnetic shielding tile on case for a blanket according to some implementations.

FIG. 14 illustrates a diagram 1400 showing an example use of electromagnetic shielding tiles 1402(1)-1402(N) on case for a blanket 1404 according to some implementations.

In the present example, each of the corners of the blanket 1404 is lined with an EM radiation shielding tile 1402. In other examples, the entire length of the blanket 1404 may be lined with the EM radiation shielding tiles 1402. In some particular cases, the EM radiation shielding tiles 1402 may be exposed to the user, while in other cases, the EM radiation shielding tiles 1402 may be enclosed between multiple layers of fabric, such that the user may be unaware of the EM radiation shielding tiles 1402 within the blanket. In one particular example, the EM radiation shielding tiles 1402 may include the microwave absorbing material that is configured to convert EMF radiation into heat. In this example, the blanket may be able to provide additional warmth via the conversion or include other materials (such as copper or aluminum thread) to spread the heat uniformly over the blanket.

Figure 15:
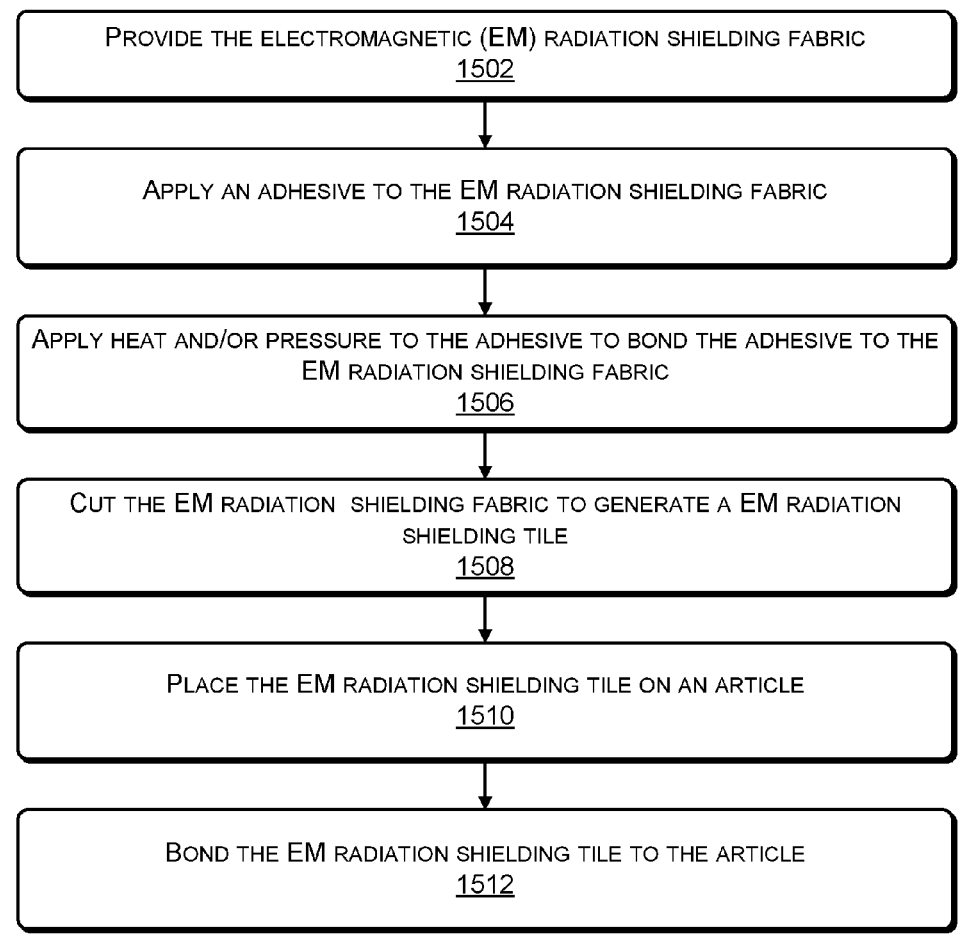
FIG. 15 illustrates an example flow diagram showing an illustrative process for forming an EM radiation shielding tile according to some implementations.
Figure 16:
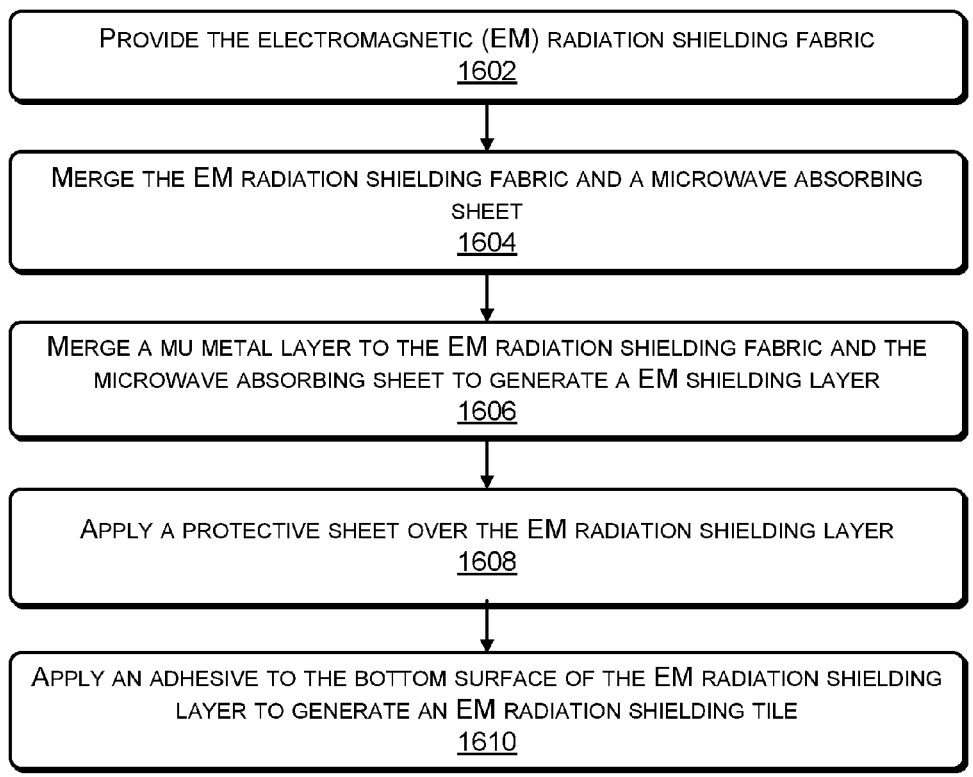
FIG. 16 illustrates another example flow diagram showing an illustrative process for forming an EM radiation shielding tile according to some implementations.
Figure 17:
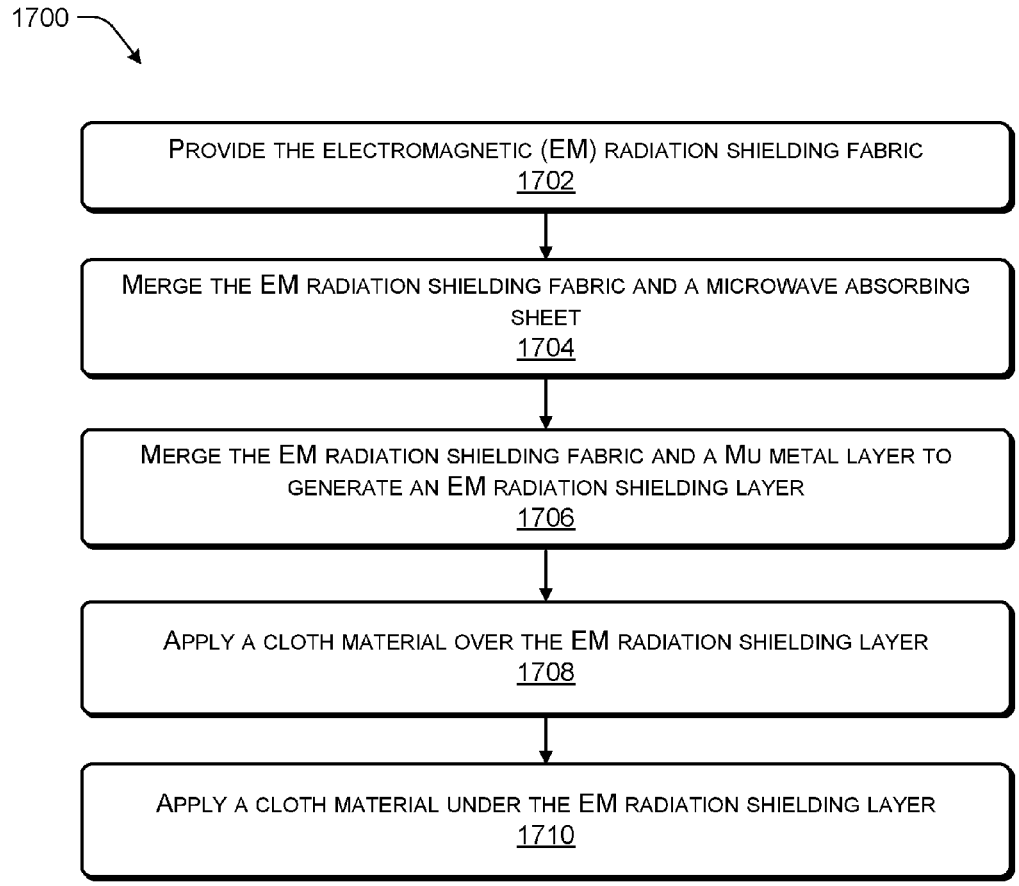
FIG. 17 illustrates yet another example flow diagram showing an illustrative process for forming an EM radiation shielding tile according to some implementations.

FIGS. 15-17 are flow diagrams illustrating example processes for generating an EM radiation shielding tiles as described above. The processes are illustrated as a collection of blocks in a logical flow diagram, which represent a sequence of operations, some or all of which can be implemented in hardware, software or a combination thereof.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 15 illustrates an example flow diagram showing an illustrative process 1500 for forming an EM radiation shielding tile according to some implementations. As described above, many electronic devices, including mobile devices (such as cell phones, tablets, and laptop computers) emit EMF while in use. In some cases, the EMF radiation may be harmful to humans (such as during extended period of exposure). In fact, in some instances, the devices may be shipped with warning recommending and/or instructing the user of the device to maintain a predetermined distance from the electronic device while the device is active. Unfortunately, many people today often carry devices (such as mobile phones or tablets) in their pockets or in close proximity to their bodies, while other users often place the devices such as laptops and tablet in their lap during use. Still other users may hold devices such as mobile phones against the user's head when speaking or conducting a phone conversation. In each of these cases, the user may be exposed to harmful EMF radiation that may have unknown side effects.

The process 1500 described herein, one process for forming an EM radiation shielding tile, patch, and/or fabric that may be applied to various surfaces (such as the interior pocket of a pair pants, the bottom of a laptop, etc.) to reduce a user exposure to the EMF radiation emitted by the user's everyday devices.

At 1502, an EM radiation shielding fabric is provided. In some cases, the EM radiation shielding fabric may include a copper/silver thread that is woven together with a portion of cotton thread to deflect EMF radiation in a manner similar to a Faraday cage or Faraday shield. In particular, the EM radiation shielding fabric may include a cotton fiber threaded with a gossamer-thin 0.02 millimeter (mm) silvered and polyurethane (PU) coated spun-in copper thread. For example, the EM radiation shielding fabric may be formed from 90% cotton fiber and 10% PU-silver-copper thread.

At 1504, an adhesive is applied to the EM radiation shielding fabric. For example, the EM radiation shielding fabric may be applied to a first surface (such as the bottom surface) of the EM fabric. For example, the adhesive may be a powder adhesive that is sprinkled, sprayed, or even applied via sputtering techniques to the first surface of the EM fabric.

At 1506, heat and/or pressure is applied to the adhesive to bond the adhesive to the EM radiation shielding fabric. For example, a heat source (such as a heat lamp) may cause the powder adhesive to bond with the EM fabric. In other cases, the adhesive may be a gel or solid adhesive that may be placed on the EM fabric followed by the application of heat and/or pressure. In one particular example, the EM fabric and the solid adhesive may be applied via a roll-to-roll process.

At 1508, the EM fabric may be cut to generate an EM radiation shielding tile. For example, the EM fabric may be cut to a desired shape, such as slightly larger than a smart phone. For example, the EM radiation shielding tiles may be stamped into sets of two 6 inch by 6 inch tiles that are separated by a perforation also applied by the stamp.

At 1510, the EM radiation shielding tile is placed on an article, such as a piece of clothing. The EM radiation shielding tile may be placed with the first surface or the adhesive facing down towards the article.

At 1512, heat is reapplied to the EM radiation shielding tile to bond the tile to the article. In some cases, the reapplication of heat to the adhesive may cause the adhesive to reactivate and, thus, to bond the EM fabric to the article. For example, a customer may utilize an iron or blow dryer to apply heat to the EM radiation shielding tile once the EM radiation shielding tile is positioned onto the article.

FIG. 16 illustrates another example flow diagram showing an illustrative process for forming an EM radiation shielding tile according to some implementations. The process 1600 described herein, one process for forming an EM radiation shielding tile, patch, and/or fabric that may be applied to various surfaces (such as the interior pocket of a pair pants, the bottom of a laptop, etc.) to reduce a user exposure to the EMF radiation emitted by the user's everyday devices.

At 1602, an EM radiation shielding fabric is provided. In some cases, the EM radiation shielding fabric may include a copper/silver thread that is woven together with a portion of cotton thread to deflect EMF radiation in a manner similar to a Faraday cage or Faraday shield. In particular, the EM radiation shielding fabric may include a cotton fiber threaded with a gossamer-thin 0.02 millimeter (mm) silvered and polyurethane (PU) coated spun-in copper thread. For example, the EM radiation shielding fabric may be formed from 90% cotton fiber and 10% PU-silver-copper thread.

At 1604, the EM radiation shielding fabric is merged with a microwave absorbing sheet. In some cases, the microwave absorbing material layer may be formed from carbon, foam, various magnetic materials, among others. The microwave absorbing sheet may be merged with the EM radiation shielding fabric via a roll-to-roll process or within a vacuum chamber under pressure. In some cases, an adhesive (e.g., a powder adhesive or a solid adhesive) may be placed between the EM fabric and the microwave absorbing materials, while pressure is applied via the vacuum chamber or one or more rollers. In some cases, heat may be applied to the adhesive to cause the EM fabric to bond to the microwave absorbing material.

At 1606, the EM radiation shielding fabric and the microwave absorbing material is merged with a mu metal layer to generate an EM radiation shielding layer. The mu metal may be merged with the EM radiation shielding fabric via a roll-to-roll process or within a vacuum chamber under pressure. In some cases, an adhesive (e.g., a powder adhesive or a solid adhesive) may be placed between the EM fabric and the microwave absorbing materials, while pressure is applied via the vacuum chamber or one or more rollers. In some cases, heat may be applied to the adhesive to cause the EM fabric to bond to the microwave absorbing material. In other cases, the mu metal layer may be laminated with the EM radiation shielding fabric and the microwave absorbing material.

At 1608, a protective sheet is applied over the EM radiation shielding layer. For example, the protective sheet may be a vinyl, polymer, plastic, and polycarbonate, polyester which is cut and placed over the EM radiation shielding layer. Again pressure and or heat may be applied to merge or laminate the protective sheet to the EM radiation shielding layer.

At 1610, an adhesive is applied to the EM radiation shielding layer to complete the EM radiation shielding tile. For example, the adhesive may be applied to the opposite surface of the EM radiation shielding layer as the protective sheet (such as the bottom surface). For example, the adhesive may be a powder adhesive that is sprinkled, sprayed, or even applied via sputtering techniques to the surface of the EM radiation shielding layer. In some cases, heat and/or pressure is applied to the adhesive to bond the adhesive to the EM radiation shielding layer. For example, a heat source (such as a heat lamp) may cause the powder adhesive to bond with the EM radiation shielding layer. In other cases, the adhesive may be a gel or solid adhesive that may be placed on the EM radiation shielding layer followed by the application of heat and/or pressure. In one particular example, the EM radiation shielding layer and the solid adhesive may be applied via a roll-to-roll process.

FIG. 17 illustrates yet another example flow diagram showing an illustrative process for forming an EM radiation shielding tile according to some implementations. The process 1700 described herein, one process for forming an EM radiation shielding tile, patch, and/or fabric that may be applied to various surfaces (such as the interior pocket of a pair pants, the bottom of a laptop, etc.) to reduce a user exposure to the EMF radiation emitted by the user's everyday devices.

At 1702, an EM radiation shielding fabric is provided. In some cases, the EM radiation shielding fabric may include a copper/silver thread that is woven together with a portion of cotton thread to deflect EMF radiation to deflect EMF radiation in a manner similar to a Faraday cage or Faraday shield. In particular, the EM radiation shielding fabric may include a cotton fiber threaded with a gossamer-thin 0.02 millimeter (mm) silvered and polyurethane (PU) coated spun-in copper thread. For example, the EM radiation shielding fabric may be formed from 90% cotton fiber and 10% PU-silver-copper thread.

At 1704, the EM radiation shielding fabric is merged with a microwave absorbing sheet. In some cases, the microwave absorbing material layer may be formed from carbon, foam, various magnetic materials, among others. The microwave absorbing sheet may be merged with the EM radiation shielding fabric via a roll-to-roll process or within a vacuum chamber under pressure. In some cases, an adhesive (e.g., a powder adhesive or a solid adhesive) may be placed between the EM fabric and the microwave absorbing materials, while pressure is applied via the vacuum chamber or one or more rollers. In some cases, heat may be applied to the adhesive to cause the EM fabric to bond to the microwave absorbing material.

At 1706, the EM radiation shielding fabric and the microwave absorbing material is merged with a mu metal layer to generate an EM radiation shielding layer. The mu metal may be merged with the EM radiation shielding fabric via a roll-to-roll process or within a vacuum chamber under pressure. In some cases, an adhesive (e.g., a powder adhesive or a solid adhesive) may be placed between the EM fabric and the microwave absorbing materials, while pressure is applied via the vacuum chamber or one or more rollers. In some cases, heat may be applied to the adhesive to cause the EM fabric to bond to the microwave absorbing material. In other cases, the mu metal layer may be laminated with the EM radiation shielding fabric and the microwave absorbing material.

At 1708, a first layer cloth material is applied to the top surface of the EM radiation shielding layer. For example, a flannel, nylon, cotton, or other cloth material may be positioned over the EM radiation shielding layers. In some cases, the cloth may be merged via a roll-to-roll process.

At 1710, a second layer cloth material is applied to the bottom surface of the EM radiation shielding layer. For example, a flannel, nylon, cotton, or other cloth material may be positioned over the EM radiation shielding layers. In some cases, the cloth may be merged via a roll-to-roll process. In other cases, the first and second layer of cloth may be merged via a sewing process.

FIG. 18 illustrates a graph 1800 showing the effectiveness of the EM radiation shielding tile 100 of FIG. 1. In general, the EM radiation shielding tile 100 of FIG. 1 was tested by University of California Los Angles Center for High Frequency Electronics. During the test, the EM radiation shielding tile 100 was bombarded with EMF radiation at various frequencies and the amount and percentage of EMF radiation exposed to an object behind the EM radiation shielding tile 100 was measured. As shown in graph 1800, the EM radiation shielding tile 100 reduced the overall amount of EMF radiation exposure by between 87.40% and 99.50% and the amount of EMF radiation was reduce by as much as 46 decibels (DB) depending on the frequency of the radiation.

FIG. 19 illustrates a graph showing the effectiveness of the EM radiation shielding tile 200 of FIG. 2. In general, the EM radiation shielding tile 100 of FIG. 1 was tested by University of California Los Angles Center for High Frequency Electronics. During the test, the EM radiation shielding tile 200 was bombarded with EMF radiation at various frequencies and the amount and percentage of EMF radiation exposed to an object behind the EM radiation shielding tile 200 was measured. As shown in graph 1900, the EM radiation shielding tile 200 reduced the overall amount of EMF radiation exposure by between 92.06% and 95.53% and the amount of EMF radiation was reduce by as much as 27 decibels (DB) depending on the frequency of the radiation.

Figure 20:
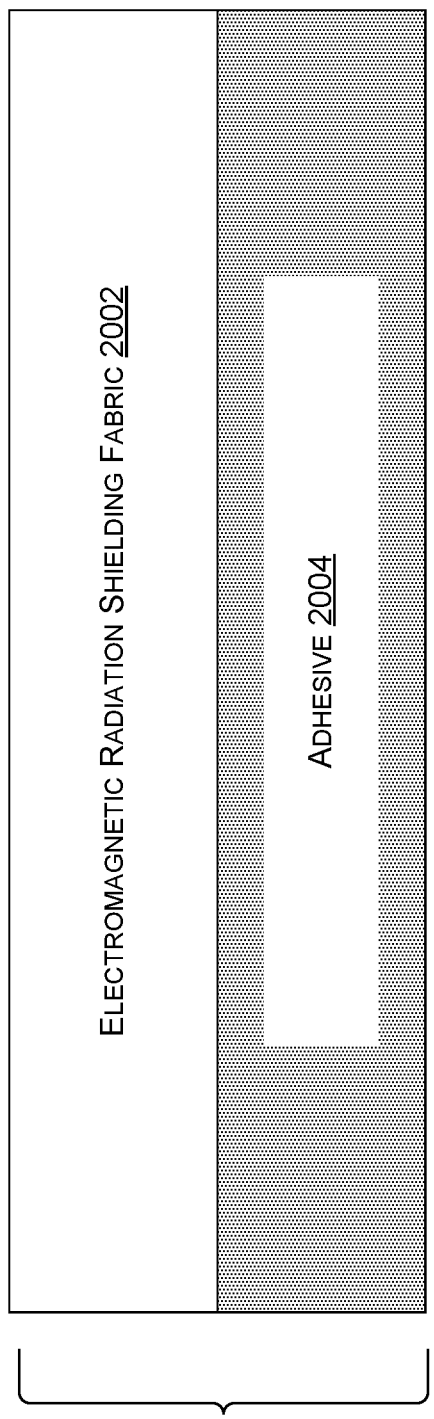
FIG. 20 illustrates a block diagram showing a cross-sectional view of an example electromagnetic radiation shielding tile according to some implementations.

FIG. 20 illustrates a block diagram showing a cross-sectional view of an example electromagnetic radiation shielding tile 2000 according to some implementations. In the illustrated example, the EM radiation shielding tile 2000 may include a layer of EM radiation shielding fabric 102 over a layer of adhesive 2004. In some cases, metal thread (nickel, copper, silver, cobalt or a combination thereof) may be woven together with the fabric thread to deflect the EMF radiation generated by today's electronic devices in a manner similar to a Faraday cage or Faraday shield. For instance, the EM radiation shielding fabric 102 may include deflect up to 99% of EMF radiation generated by an electronic device. The EM radiation shielding fabric 2002 may also include a cotton or nylon fiber thread. In some cases, the thread may be a gossamer-thin 0.02 mm silvered and PU coated spun-in copper thread. In some instances, the ratio of silver-PU-copper thread to cotton may be 1 to 9. In other words, in one example, the EM radiation shielding fabric 102 may be formed from 90% cotton fiber and 10% PU-silver-copper thread.

In some cases, the EM radiation shielding fabric 102 may be a hypoallergenic material to prevent adverse reaction between skin and the silver-PU-copper thread. However, such as in the illustrated example, the EM radiation shielding tile 100 may also include a hypoallergenic material or layer 106 applied to the opposite side of the EM radiation shielding fabric 102 as the adhesive 104. For instance, in the illustrated example, the hypoallergenic layer 106 is positioned atop the EM radiation shielding fabric 102, which in turn is positioned atop the adhesive layer 104. In this instance, the bottom layer or the adhesive 104 may be applied to another article (such as clothing) leaving the top layer or the hypoallergenic layer 106 exposed to the environment.

In some cases, the adhesive 104 may be a powder adhesive that is activated upon exposure to heat or UV radiation. For example, the adhesive 104 may be combined with the EM radiation shielding fabric 102 via a heat and roll process or a spray/sprinkle (such as sputtering) followed by an application of heat. In some cases, the heat may be applied in a factory by the manufacture to bond the adhesive layer 104 to the EM radiation shielding fabric 102 and a second application of heat may be applied by an consumer at home (via, for instance, an iron or hairdryer) to bond the EM radiation shielding tile 100 to an object or other article (such as clothing). In other cases, the adhesive 104 may be a one-time stick or non-chemical binding adhesive, such as a peel and place sticker. In some cases, the peel and place sticker may include an adhesive 104 that allows for removal and re-application of the tile to another article.

Figure 21:
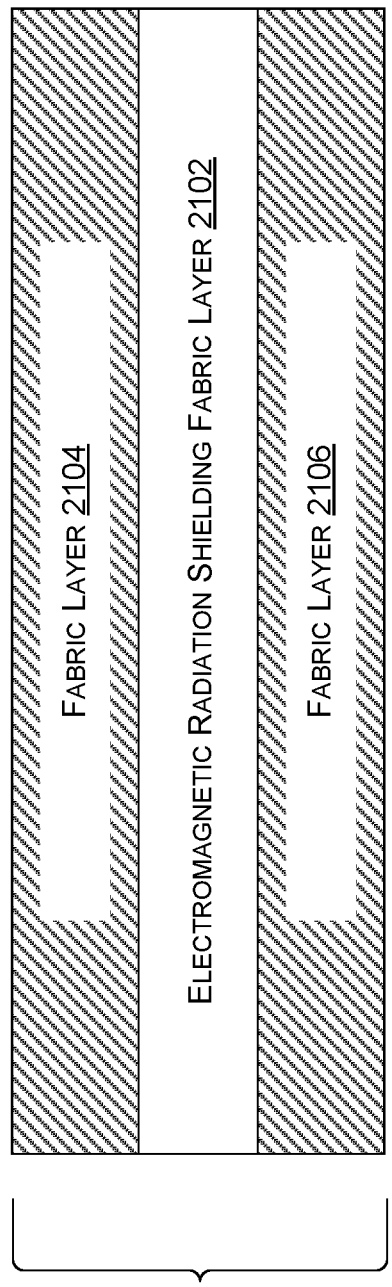
FIG. 21 illustrates another block diagram showing a cross-sectional view of an example electromagnetic radiation shielding cloth according to some implementations.

FIG. 21 illustrates another block diagram showing a cross-sectional view of an example electromagnetic radiation shielding cloth according to some implementations. The EM radiation shielding cloth 2100 includes an EM radiation shielding layer 2102 contacted to a first fabric layer 2104 and a second fabric layer 2110. Thus, the EM radiation shielding cloth 2100 may be incorporated into clothing, blankets, backpacks, bags, or other cloth or cloth like articles to provide EM protection. For instance, the EM radiation shielding cloth 2100 may be used as a flannel blanket to protect for example a swaddled child, to line the inside of a backpack to protect the wearer from EMF radiation of a device within the backpack, or within jeans to provided protection along the leg of the user. In some cases, the EM radiation shielding cloth 2100 may run the entirety of the article while in other examples the EM radiation shielding cloth 2100 may be isolated to a portion of the article (such as along the backside of a backpack).

In the illustrated example, the EM fabric layer 2102 may be a hypoallergenic fabric, as the EM fabric 2102 may be exposed to a human. However, by only including one layer of fabric 2104, the overall thickness of the EM radiation shielding cloth 2100 may be reduced, thereby reducing costs and allowing for a wider range of applications, such as for light weight clothing. For example, the fabric layer 2104 may include nylon or another breathable material.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. An electromagnetic shielding tile comprising:
 a protective layer formed from a hypoallergenic fabric having a first surface and a second surface, the second surface to be exposed to an environment;
 a first electromagnetic shielding fabric having a first surface bonded to the first surface of the protective layer and a second surface, the first electromagnetic shielding fabric formed from a first metal thread and a first fabric thread, the first metal thread is a PU-silver-copper thread;
 a first mu metal layer having a first surface bonded to the second surface of the first electromagnetic shielding fabric and a second surface;
 a first microwave absorbing layer having a first surface bonded to the second surface of the first mu metal layer, the first microwave absorbing layer including a magnetic material;
 a second electromagnetic shielding fabric having a first surface bonded to the second surface of the first microwave absorbing layer and a second surface, the second electromagnetic shielding fabric formed from a second metal thread and a second fabric thread, the first metal thread including silver and copper;
 a second mu metal layer having a first surface bonded to the second surface of the second electromagnetic shielding fabric and a second surface;
 a second microwave absorbing layer having a first surface bonded to the second surface of the second mu metal layer and a second surface, the second microwave absorbing layer including a magnetic material; and
 an adhesive layer having a first surface and a second surface, the first surface of the adhesive bonded to the second surface of the second microwave absorbing layer, the second surface of the adhesive configured to bond the electromagnetic shielding tile to an article.

2. The electromagnetic shielding tile as recited in claim 1, further comprising a protective laminate layer bonded between the first surface of the protective layer and the first surface of the electromagnetic shielding fabric.

3. The electromagnetic shielding tile device as recited in claim 1, wherein the first mu metal layer includes a mu metal formed from a nickel-iron alloy.

4. The electromagnetic shielding tile device as recited in claim 1, wherein the first microwave absorbing material layer includes:
 carbon; and
 foam.

5. The electromagnetic shielding tile device as recited in claim 1, wherein the article is designed to carry an electronic device.

6. The electromagnetic shielding tile device as recited in claim 1, wherein the article is a wall hanging.

7. The electromagnetic shielding tile device as recited in claim 1, wherein the article is an electronic device.

8. The electromagnetic shielding tile device as recited in claim 1, wherein the article is an article of clothing.

9. The electromagnetic shielding tile as recited in claim 1, further comprising a third electromagnetic shielding fabric bonded between the first surface of the protective layer and a first surface of the second electromagnetic shielding fabric, the third electromagnetic shielding fabric including a metal portion and a fabric portion.

10. The electromagnetic shielding tile as recited in claim 1, wherein the first metal thread also includes nickel and cobalt.

11. The electromagnetic shielding tile device as recited in claim 1, wherein the article is a blanket and the microwave absorbing layer acts to warm the blanket by converting electromagnetic radiation into heat.

12. The electromagnetic shielding tile as recited in claim 1, wherein the adhesive layer is activated in response to heat.

13. The electromagnetic shielding tile as recited in claim 1, wherein the first microwave absorbing layer is configured to convert radiation into heat.

14. The electromagnetic shielding tile as recited in claim 1, wherein:
   the first electromagnetic shielding fabric, the first mu metal layer, and the first microwave absorbing material form an electromagnetic shielding layer; and
   the second electromagnetic shielding fabric, the second mu metal layer, and the second microwave absorbing material form an electromagnetic shielding layer.

15. An electromagnetic shielding tile comprising:
   a protective layer formed from a hypoallergenic fabric having a first surface and a second surface, the second surface to be exposed to an environment;
   a first electromagnetic shielding fabric having a first surface bonded to the first surface of the protective layer and a second surface, the first electromagnetic shielding fabric formed from a first metal thread and a first fabric thread, the first metal thread including silver and copper;
   a first mu metal layer having a first surface bonded to the second surface of the first electromagnetic shielding fabric and a second surface;
   a first microwave absorbing layer having a first surface bonded to the second surface of the first mu metal layer, the first microwave absorbing layer consisting of a magnetic material, carbon, and foam;
   a second electromagnetic shielding fabric having a first surface bonded to the second surface of the first microwave absorbing layer and a second surface, the second electromagnetic shielding fabric formed from a second metal thread and a second fabric thread, the first metal thread including silver and copper;
   a second mu metal layer having a first surface bonded to the second surface of the second electromagnetic shielding fabric and a second surface, the mu metal layer formed from nickel and iron;
   a second microwave absorbing layer having a first surface bonded to the second surface of the second mu metal layer and a second surface, the second microwave absorbing layer consisting of a magnetic material, carbon, and foam; and
   an adhesive layer having a first surface and a second surface, the first surface of the adhesive bonded to the second surface of the second microwave absorbing layer, the second surface of the adhesive configured to bond the electromagnetic shielding tile to an article.

16. An electromagnetic shielding tile comprising:
   a protective layer formed from a hypoallergenic fabric having a first surface and a second surface, the second surface to be exposed to an environment;
   a first electromagnetic shielding fabric having a first surface bonded to the first surface of the protective layer and a second surface, the first electromagnetic shielding fabric formed from a first metal thread and a first fabric thread, the first metal thread including silver, copper, nickel, and cobalt;
   a first mu metal layer having a first surface bonded to the second surface of the first electromagnetic shielding fabric and a second surface;
   a first microwave absorbing layer having a first surface bonded to the second surface of the first mu metal layer, the first microwave absorbing layer including a magnetic material;
   a second electromagnetic shielding fabric having a first surface bonded to the second surface of the first microwave absorbing layer and a second surface, the second electromagnetic shielding fabric formed from a second metal thread and a second fabric thread, the first metal thread including silver and copper;
   a second mu metal layer having a first surface bonded to the second surface of the second electromagnetic shielding fabric and a second surface;
   a second microwave absorbing layer having a first surface bonded to the second surface of the second mu metal layer and a second surface, the second microwave absorbing layer including a magnetic material; and
   an adhesive layer having a first surface and a second surface, the first surface of the adhesive bonded to the second surface of the second microwave absorbing layer, the second surface of the adhesive configured to bond the electromagnetic shielding tile to an article.

17. The electromagnetic shielding tile device as recited in claim 16, wherein the article is designed to carry an electronic device.

18. The electromagnetic shielding tile device as recited in claim 16, wherein the article is a blanket.

19. The electromagnetic shielding tile device as recited in claim 16, wherein the article is an article of clothing.

* * * * *